(12) United States Patent
Kawamura

(10) Patent No.: US 8,410,564 B2
(45) Date of Patent: Apr. 2, 2013

(54) SEMICONDUCTOR DEVICE, METHOD OF MANUFACTURING THE SAME, AND WIRELESS TRANSMISSION SYSTEM UTILIZING THE SAME

(75) Inventor: Hirofumi Kawamura, Chiba (JP)

(73) Assignee: Sony Corporation, Tokyo (JP)

( * ) Notice: Subject to any disclaimer, the term of this patent is extended or adjusted under 35 U.S.C. 154(b) by 196 days.

(21) Appl. No.: 12/903,336

(22) Filed: Oct. 13, 2010

(65) Prior Publication Data

US 2011/0095385 A1 Apr. 28, 2011

(30) Foreign Application Priority Data

Oct. 22, 2009 (JP) ................................. 2009-243108

(51) Int. Cl.
*H01L 27/14* (2006.01)

(52) U.S. Cl. ........................................................ 257/428
(58) Field of Classification Search .................. 257/428
See application file for complete search history.

(56) References Cited

U.S. PATENT DOCUMENTS

2010/0327068 A1* 12/2010 Chen et al. .................... 235/492

FOREIGN PATENT DOCUMENTS

| JP | 2002-100698 | 4/2002 |
| JP | 2009-038696 | 2/2009 |

* cited by examiner

*Primary Examiner* — Shaun Campbell
(74) *Attorney, Agent, or Firm* — SNR Denton US LLP

(57) ABSTRACT

A device, and method for manufacturing the same, including a semiconductor package which allows transmission therethrough of a radio signal, a chip which generates the radio signal and a coupler adjacent the chip and effective to radiate the radio signal to outside of the semiconductor package.

11 Claims, 12 Drawing Sheets

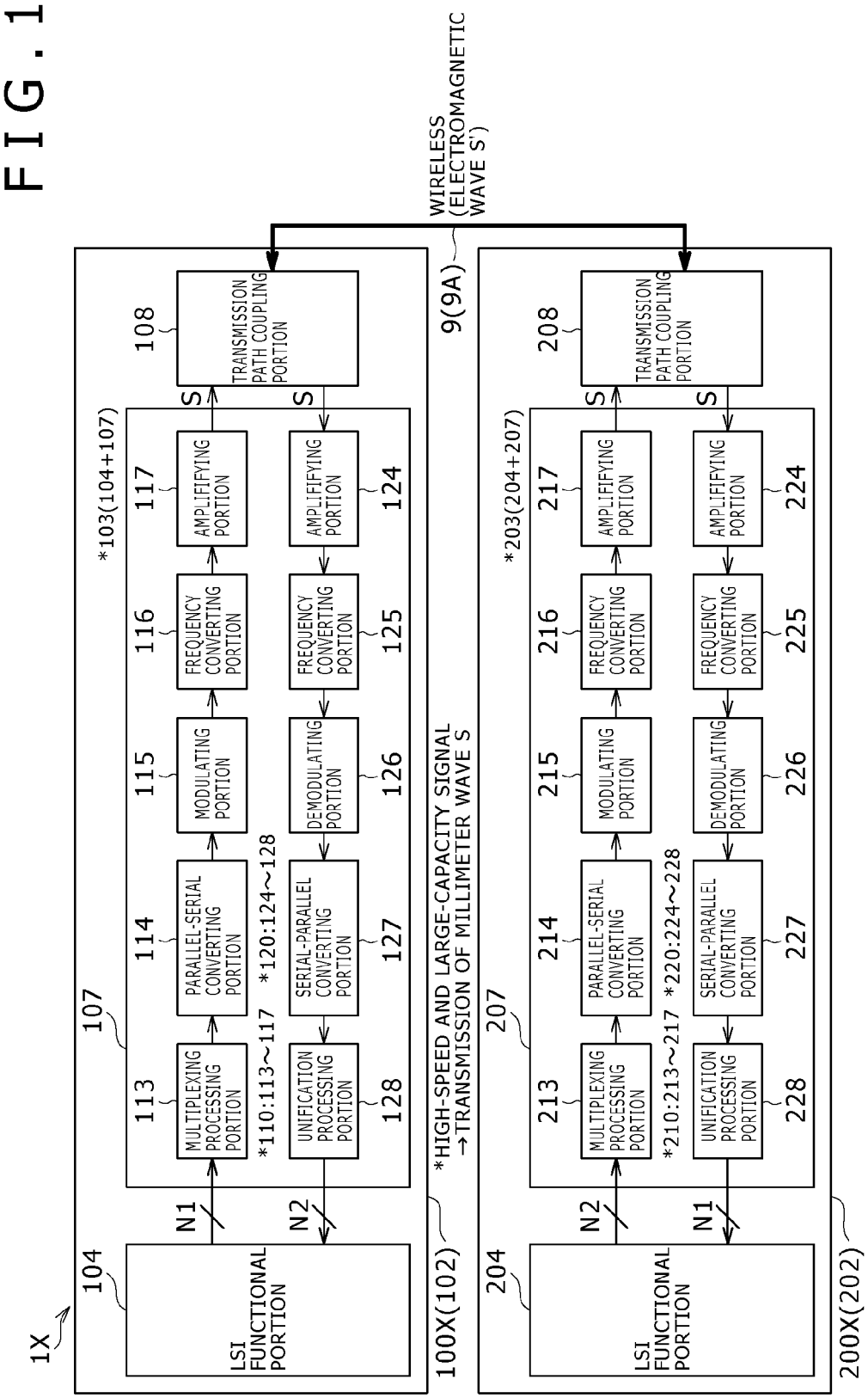

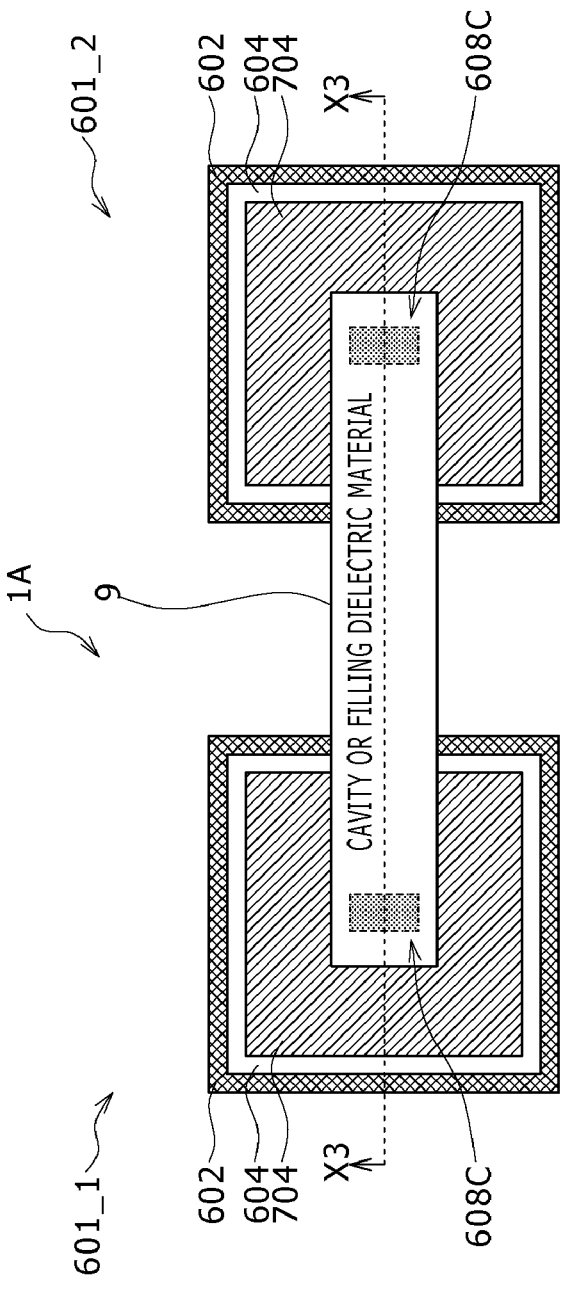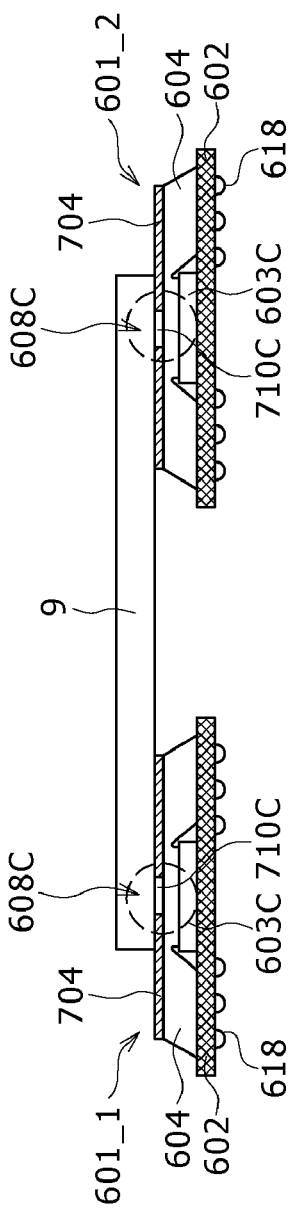
FIG.11A
FIG.11B

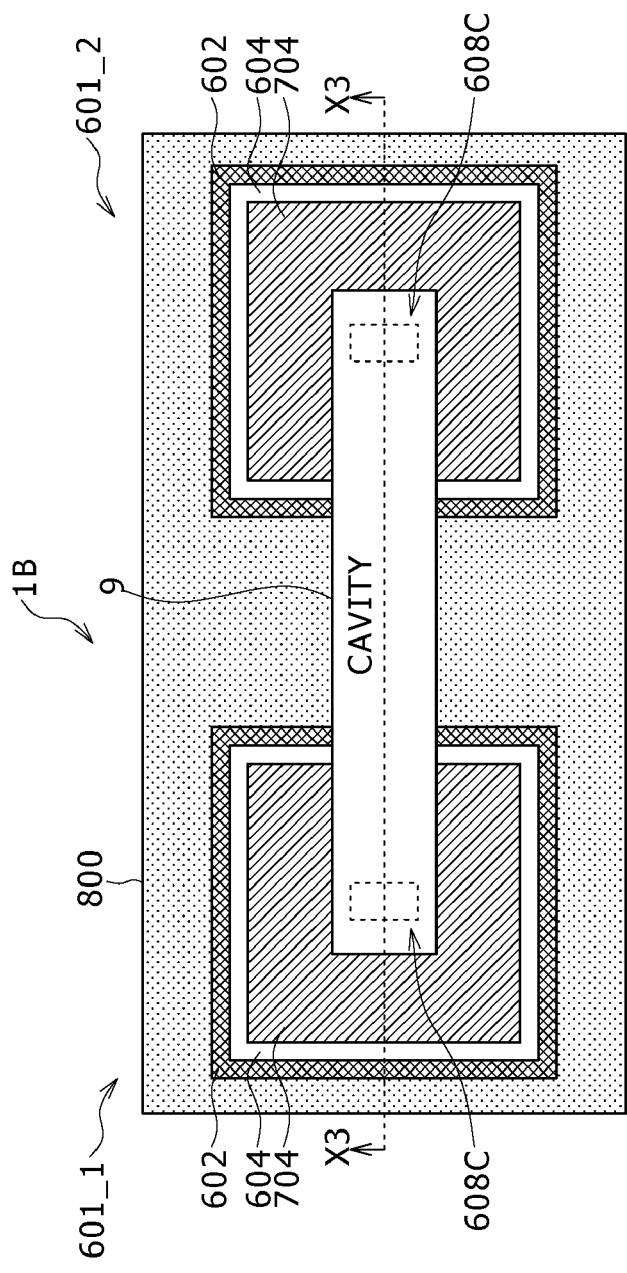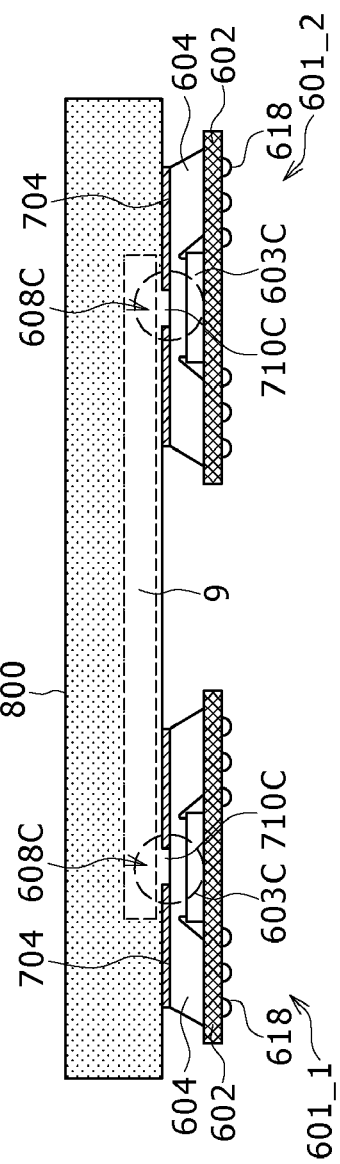
FIG. 12A
FIG. 12B

SEMICONDUCTOR DEVICE, METHOD OF MANUFACTURING THE SAME, AND WIRELESS TRANSMISSION SYSTEM UTILIZING THE SAME

RELATED APPLICATION DATA

The present application claims priority to Japanese Patent Application JP 2009-243108 filed in the Japan Patent Office on Oct. 22, 2009, the entirety of which is hereby incorporated by reference herein to the extent permitted by law.

BACKGROUND OF THE INVENTION

The present invention relates to a semiconductor device, a method of manufacturing the same, and a wireless transmission system utilizing the same.

Semiconductor devices to which a semiconductor chip for communication is mounted, and a wireless transmission system utilizing such a semiconductor device are known. A semiconductor device and wireless transmission system, is described in Japanese Patent Laid-Open Nos. 2002-100698 and 2009-038696 (hereinafter referred to as Patent Documents 1 and 2). Such a semiconductor chip for communication is normally provided in a package.

With any of the techniques described in Patent Documents 1 and 2, a semiconductor chip having a wireless transmission function is provided inside a package, an antenna structure is provided in the package, and thus data transmission is carried out through the antenna.

For example, with the technique described in Patent Document 1, a semiconductor chip and external connection terminals are provided in a circuit substrate, and a filter circuit layer is provided in an inner layer of the circuit substrate. In this case, the filter circuit is electrically connected to the semiconductor chip, thereby taking out a high-frequency electric signal in a required frequency band. Also, an antenna circuit layer electrically connected to the filter circuit layer is provided on a surface layer of the circuit substrate. It is described in Patent Document 1 that the miniaturization can be carried out because the filter circuit layer and the antenna circuit layer is incorporated integrally with the circuit substrate having the semiconductor chip mounted thereto, and the cost is also reduced because the number of parts is reduced.

Patent Document 2 proposes an integrated circuit package with an antenna in which a waveguide is provided in a thickness direction of a chassis portion, and thus a micro-strip/waveguide conversion is carried out. Specifically, a side to which an integrated circuit chip of a chassis portion is mounted is mounted like a flip chip to a mounting substrate, and a planar antenna is provided on a side opposite to the chassis portion. It is described in Patent Document 2 that the small integrated circuit package with an antenna is obtained because with the structure that all the constituent elements are mounted to a front surface side of the mounting substrate, the antenna is provided in the chassis portion.

However, with the technique described in Patent Document 1, since the various kinds of structural elements are disposed outside the semiconductor chip, when the various kinds of structural elements are all desired to be encapsulated, the package size becomes large. In addition, the technique described in Patent Document 1 requires both the filter circuit layer and the antenna circuit layer. Thus, the layer structure is complicated, and it cannot be said that the cost is reduced. In addition, it is also thought that the transmission characteristics are deteriorated due to the multilayer structure having a wire and a via. Thus, Patent Document 1 involves the drawbacks that must be solved.

With the technique described in Patent Document 2, since the base is made of a metal, and the structure is disposed outside the chip, the package size becomes large. Additionally, the manufacture of the integrated circuit package with the antenna is difficult. As such, the technique described in Patent Document 2 involves special manufacturing, which is a drawback.

SUMMARY OF THE INVENTION

In accordance with principles of the invention, a semiconductor device can be provided, having a semiconductor chip for communication mounted thereto, which is easy to manufacture and for which a package size does not become so large, a method of manufacturing the same, and a wireless transmission system utilizing the same.

In an embodiment, there is device including a semiconductor package which allows transmission therethrough of a radio signal, a chip which generates the radio signal and a coupler adjacent the chip and effective to radiate the radio signal to outside of the semiconductor package.

In another embodiment, the device further includes a semiconductor layer within the semiconductor package, a dielectric layer above the semiconductor layer, the dielectric layer including a transmission path therein, a via hole in the dielectric layer, a conductor layer on the dielectric layer, a pattern in the conductor layer formed by at least two openings in the conductor layer and a portion of the conductor layer in between the openings. In this embodiment, the semiconductor layer and the dielectric layer form the chip, and the via hole is operatively connected to the transmission path and the conductor layer.

In another embodiment, the device includes a transmission path within the semiconductor package, a conductor layer facing the transmission path, and a slot structure comprising of an opening formed in the conductor layer. In this device, the transmission path and the slot structure are coupled to each other.

In another embodiment of the device the slot structure and the transmission path are electromagnetically coupled to each other.

In another embodiment, the device the conductor layer is a boundary between the dielectric layer and the outside of the semiconductor package.

In another embodiment, the pattern in the conductor layer includes a plurality of openings in the conductor layer and a plurality of portions of the conductor layer in between the openings. The portions of the conductor layer in the pattern are not electrically connected to each other, and one of the portions of the conductor layer is electrically connected to the transmission path.

In another embodiment, the device includes an antenna on the semiconductor package and the coupler adjacent the chip is effective to radiate the radio signal to the antenna.

In another embodiment there is a a second transmission path in between semiconductor package and the antenna. In this embodiment, the second transmission path and the antenna are electrically connected to each other.

In another embodiment, the device includes a structure with a wireless transmission path which is effective to transmit the radio signal. This structure can be a waveguide.

In another embodiment, a wireless transmission system includes at least two chips, at least one of which is configured to generate a radio signal and at least one of the chips contained in semiconductor package which allows transmission therethrough of the radio signal.

In another embodiment, the wireless transmission system includes an antenna, and the radio signal is transmitted to the antenna.

In another embodiment the wireless transmission system includes a structure with a wireless transmission path operatively associated with the least two chips and which is effective to transmit the radio signal between to the at least two chips. This structure can be a waveguide.

In another embodiment there is an electronic apparatus that includes a semiconductor package which allows transmission therethrough of a radio signal, a chip which generates the radio signal and a coupler adjacent the chip and effective to radiate the radio signal to outside of the semiconductor package. 18. In another embodiment of the invention there is an electronic apparatus that includes a wireless transmission system. The wireless transmission system comprises (1) at least two chips, at least one of which is configured to generate a radio signal and (2) at least one of the chips contained in semiconductor package which allows transmission therethrough of the radio signal.

In another embodiment, there is a method of manufacturing a semiconductor package that includes the steps of providing an electronic chip configured to generate a radio signal, providing a coupler adjacent the chip which is effective to radio the radio signal away from the chip, and forming a semiconductor package about the chip and the coupler through which the radio signal can be transmitted.

In another embodiment, the method for manufacturing a semiconductor package includes the steps of forming a semiconductor layer within the semiconductor package, forming a dielectric layer on the semiconductor layer, forming the transmission path within the dielectric layer, forming a slot structure comprising an opening in the conductor layer and coupling the transmission path and the slot structure to each other. In this embodiment, the semiconductor layer and the dielectric layer form the chip. In another embodiment, the transmission path can be formed integrally with the chip. Additionally, in a further embodiment, the transmission path can be formed in the same process as a wiring of the chip.

As set forth hereinabove, according to principles of the present invention, the high-frequency signal coupling structure with the slot structure as the base is formed by utilizing the encapsulation member for encapsulating the semiconductor chip. Therefore, it is possible to realize the semiconductor device which is easy to manufacture and for which the package size does not become so large, the method of manufacturing the same, and the wireless transmission system utilizing the same.

BRIEF DESCRIPTION OF THE DRAWINGS

FIG. 1 is a block diagram explaining a basic configuration of an embodiment mode of a wireless transmission system according to principles of the present invention;

FIGS. 11A and 11B are respectively a top plan view of a first embodiment of a wireless transmission system, and a cross sectional view taken on line X3-X3 of FIG. 11A; and FIGS. 12A and 12B are respectively a top plan view explaining a second embodiment of the wireless transmission system, and a cross sectional view taken on line X3-X3 of FIG. 12A.

DETAILED DESCRIPTION OF THE PRESENTLY PREFERRED EMBODIMENTS

Figure 2A:
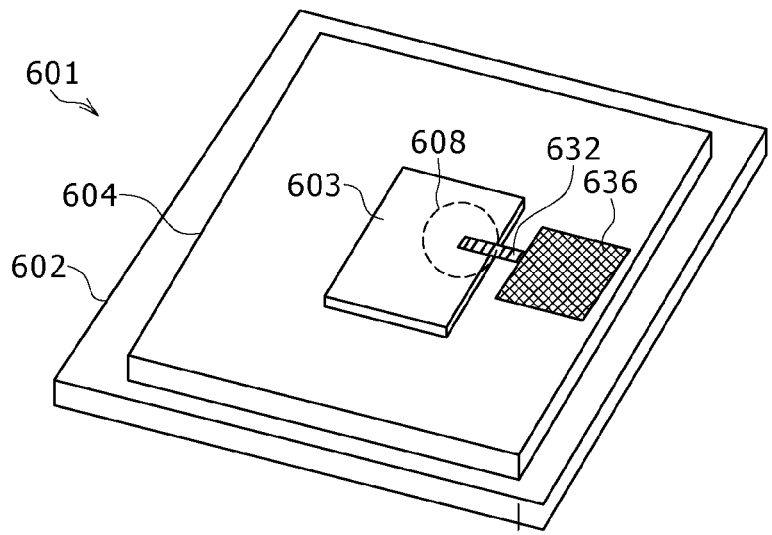
FIGS. 2A to 2C are respectively a perspective view showing an outer structure of an embodiment mode of a semiconductor package according to principles of the present invention, a top plan view of the semiconductor package shown in FIG. 2A, and a cross sectional view taken on line X3-X3 of FIG. 2B.

The presently preferred embodiments according to principles of the present invention will be described in detail hereinafter with reference to the accompanying drawings. When functional constituent elements are distinguished among embodiments, the functional constituent elements are described by adding reference symbols of upper case alphabetic characters such as A, B, C, . . . to original reference numerals, respectively. On the other hand, when the description is given without the especial distinction, the functional constituent elements are described with these reference symbols being omitted. This also applies to the drawings.

FIG. 1 is a block diagram explaining a basic configuration of an embodiment mode of a wireless transmission system according to principles of the present invention. Here, FIG. 1 is a block diagram explaining a signal interface of the wireless transmission system 1X having the basic configuration from a side of a functional configuration.

A carrier frequency used in an embodiment mode of a wireless transmission system according to principles of the present invention is explained as a millimeter waveband. However, the configuration of the embodiment mode of the wireless transmission system is by no means limited to the millimeter waveband, and thus can also be applied to the case where a carrier frequency in a shorter wavelength, for example, in a microwave band. The embodiment mode of wireless transmission system according to principles of the present invention is applied to a wireless communication which, for example, is used in a digital recording/reproducing apparatus, a terrestrial TV receiver, a mobile phone, a game machine, a computer or the like.

As shown in FIG. 1, the wireless transmission system 1X is configured in such a way that a first communication apparatus 100X as an example of a first wireless apparatus, and a second communication apparatus 200X as an example of a second wireless apparatus are connected to each other through a millimeter wave signal transmission path 9 as an example of a wireless signal transmission path, thereby carrying out the signal transmission in a millimeter waveband. The millimeter wave signal transmission path 9 is the example of the wireless signal transmission path as described above. A signal as an object of transmission is frequency-converted into a millimeter wave signal in a millimeter waveband suitable for broadband transmission, and the resulting millimeter wave signal obtained through the frequency conversion is transmitted.

The first communication apparatus (first millimeter wave transmission apparatus) and the second communication apparatus (second millimeter wave transmission apparatus) compose the wireless transmission apparatus (system). Also, after the signal as the object of the transmission is frequency-converted into the millimeter wave signal, the resulting millimeter wave signal is transmitted between the first communication apparatus and the second communication apparatus which are disposed at a relatively short distance, for example a distance less than the distance between the communication apparatuses in the field which are used in broadcasting or the general wireless communication, through the millimeter wave signal transmission path. Wireless transmission means that a signal is not transmitted through an electric wiring, but is transmitted in a wirelessly.

The wireless communication in this case, for example, corresponds to an inter-substrate communication within the chassis of one electronic apparatus, an inter-chip communication on the same substrate, or a communication among a plurality of electronic apparatuses in which a plurality of electronic apparatuses are integrated, in communication with or connected to each other. For example, where one electronic apparatus is mounted to the other electronic apparatus, where the range of the transmission between both the electronic apparatuses is in a closed space, or where both the electronic apparatuses are disposed at a distance, for example, within the range of several centimeters to more than ten centimeters, from each other.

Hereinafter, the signal transmission within the chassis of one electronic apparatus is referred to as "intra-chassis signal transmission," and the signal transmission in a state in which a plurality of electronic apparatuses are integrated with one another (hereinafter containing "substantially integrated with one another") is referred to as "inter-apparatus signal transmission." In the case of the intra-chassis signal transmission, the embodiment mode of the wireless transmission system in which the communication apparatus on the transmission side, the transmission portion, and the communication apparatus on the reception side, the reception portion, are accommodated in the same chassis, and the wireless signal transmission path is formed between the transmission portion and the reception portion becomes the electronic apparatus itself. On the other hand, in the case of the intra-apparatus signal transmission, when the communication apparatus on the transmission side, the transmission portion, and the communication apparatus on the reception side, the reception portion, are accommodated in the chassis of the different electronic apparatuses, the wireless signal transmission path is formed between the transmission portion and the reception portion within both the electronic apparatuses, thereby building the embodiment mode of the wireless transmission system.

In the communication apparatuses provided across the millimeter wave signal path from each other, the transmission portion and the reception portion can be disposed in pairs. The signal transmission between one communication apparatus and the other communication apparatus may be either one-way signal transmission or two-way signal transmission. For example, when a first communication apparatus becomes the transmission side, and a second communication apparatus becomes the reception side, the transmission portion is disposed in the first communication apparatus, and the reception portion is disposed in the second communication apparatus. On the other hand, when the second communication apparatus becomes the transmission side, and the first communication apparatus becomes the reception side, the transmission portion is disposed in the second communication apparatus, and the reception portion is disposed in the first communication apparatus.

The transmission portion, for example, includes a signal generating portion, capable of converting an electric signal into a millimeter wave signal or a signal into a transmission signal on the transmission side, and a signal coupling portion on the transmission side. In this case, the signal generating portion on the transmission side signal-processes a signal, such as an electronic signal, to generate a millimeter wave signal. The signal coupling portion on the transmission side couples the millimeter wave signal generated in the signal generating portion on the transmission side to a transmission path (millimeter wave signal transmission path) through which the millimeter wave signal is transmitted. Preferably, it is better that the signal generating portion on the transmission side is integrated with the functional portion for generating the signal as the object of the transmission.

For example, the signal generating portion on the transmission side includes a modulating circuit, and the modulating circuit modulates the signal as the object of the transmission. The signal generating portion on the transmission side frequency-converts the signal after having been modulated by the modulating circuit to generate the millimeter wave signal. In principle, it is also expected to convert the signal as the object of the transmission into the millimeter wave signal. The signal coupling portion on the transmission side supplies the millimeter wave signal generated by the signal generating portion on the transmission side to the millimeter wave signal transmission path.

On the other hand, the reception portion, for example, includes a signal coupling portion on the reception side, and a signal generating portion, capable of converting a millimeter wave signal into an electric signal as an object of transmission on the reception side. In this case, the signal coupling portion on the reception side receives the millimeter wave signal transmitted thereto through the millimeter wave signal transmission path. The signal generating portion on the reception side signal-processes the millimeter wave signal (input signal) received by the signal coupling portion on the reception side to generate the normal electric signal (the signal as the object of the transmission). Preferably, it is better that the signal generating portion on the reception side is integrated with the functional portion for receiving the signal as the object of the transmission. For example, the signal generating portion on the reception side includes a demodulating portion and frequency-converts the millimeter wave signal to generate an output signal. After that, the demodulating portion demodulates the output signal to generate the signal for transmission. In principle, it is also expected to directly convert the millimeter wave signal into the signal for transmission.

In a words, for obtaining the signal interface, the signal as the object of the transmission is transmitted in the form of the millimeter wave signal on a contactless, wireless or cableless basis. Preferably, at least the signal, especially, an image capturing signal for which high-speed transmission or large-capacity transmission is required or a high-speed master clock signal, is transmitted in the form of the millimeter wave signal. In other words, the signal which has been transmitted through the electric wiring in the existing case is transmitted in the form of the millimeter wave signal in the wireless transmission system. By carrying out the signal transmission in the millimeter waveband, the signal transmission can be realized at a high speed on the order of Gbps, the extent of the millimeter wave signal can be readily limited, and the effect due to this property can be obtained.

Here, all it takes is that the signal coupling portions allow the millimeter wave signal to be transmitted between the first communication apparatus and the second communication apparatus through the millimeter wave signal transmission path. For example, the signal coupling portion either may include an antenna structure such as an antenna coupling portion or may have the coupling without including the antenna structure.

Although "the millimeter wave signal transmission path through which the millimeter wave signal is transmitted" may be air (so-called free space), or have a constructed transmission path that confines the millimeter wave signal Although a so-called waveguide, for example, is typically expected as such a millimeter wave confining structure, or a wireless signal confining structure, the present invention is by no means limited thereto. For example, a construction made of a dielectric material allowing the millimeter wave signal to be transmitted to make a dielectric transmission path or as an intra-millimeter wave dielectric transmission path a hollow waveguide can also be used. In the hollow waveguide, a shielding material which composes the transmission path and serves to suppress the external radiation of the millimeter wave signal is provided so as to surround the transmission path. Also, the inside of the shielding material is hollow. The dielectric material or the shielding material is given the flexibility, thereby making it possible to distribute the millimeter wave signal transmission path.

When the transmission path is through the air, or free space, each of the signal coupling portions adopts the antenna structure, and the signal is transmitted between the antenna structures disposed at the short distance through the space. When the construction is made of the dielectric material, the antenna structure can be used, but, this is not essential.

Hereinafter, a configuration of the wireless transmission system according to principles of the present invention will be described. It is noted that although the case where each of the functional portions is configured in the form of the semiconductor integrated circuit (chip) this is not to be construed as limiting in any way and other suitable circuits can be used in place of the chip.

In a first communication apparatus 100X, a semiconductor chip 103 with which a communication can be carried out in the millimeter waveband is provided on a substrate 102, and in a second communication apparatus 200X as well, a semiconductor chip 203 with which the communication can be carried out in the millimeter waveband is provided on a substrate 202. It is noted that although the form such that the semiconductor chip 103 of the first communication apparatus 100X, and the semiconductor chip 203 of the second communication apparatus 200X are formed on the different substrates 102 and 202, respectively, is shown for the sake of convenience in consideration of the case as well of the wireless transmission between the electronic apparatuses, that form is not essential to the present invention. In the case of the wireless transmission within the electronic apparatus (within the chassis), for example, there may also be adopted a form such that the first communication apparatus 100X and the second communication apparatus 200X are accommodated in the same chassis, and the semiconductor chips 103 and 203 are mounted to the same substrate.

In the wireless transmission system 1X, the signal becoming an object of a communication in the millimeter waveband is limited only to a signal for which a high-speed property and a large-capacity property are required. Thus, other signals which are enough even in a low-speed property and a small-capacity property, and a signal, from a power source or the like, which is regarded as a DC (direct current) signal are each not made an object of conversion into the millimeter wave signal. With regard to these signals (including the DC signal from the power source) each of which is not made the object of the conversion into the millimeter wave signal, the connection of the signal between the substrates is obtained by using the existing configuration. It is noted that the original electric signals each as the object of the transmission before having been converted into the millimeter waves are collectively referred to as "a base-band signal."

In the first communication apparatus 100X, a semiconductor chip 103 with which the communication can be carried out in the millimeter waveband, and a transmission path coupling portion 108 are both mounted on a substrate 102. The semiconductor chip 103 is a system Large Scale Integrated Circuit ("LSI") in which an LSI functional portion 104 and a signal generating section 107 (millimeter wave signal generating portion) are integrated with each other. Although not illustrated, a configuration may also be adopted such that the LSI functional portion 104 and the signal generating section 107 are not integrated with each other. When the LSI functional portion 104 and the signal generating section 107 are provided separately from each other, with regard to the signal transmission between the LSI functional portion 104 and the signal generating section 107, a problem caused by transmitting the signal through the electric wiring is feared. Therefore, it is preferable to integrate the LSI functional portion 104 and the signal generating section 107 with each other. When the LSI functional portion 104 and the signal generating section 107 are provided separately from each other, preferably, the two chips (between the LSI functional portion 104 and the signal generating section 107) are disposed at a short distance, and the wire is wired as short as possible through the wire bonding process, thereby reducing negative influence.

The signal generating section 107 and the transmission path coupling portion 108 are made to adopt a configuration having the two-way property of the data. For this reason, a signal generating portion on the transmission side, and a signal generating portion on the reception side are both provided in the signal generating section 107. Although the transmission path coupling portion 108 may be provided in each of the transmission side and the reception side, in the embodiment mode of the wireless transmission system 1X, the transmission coupling portion 108 is used for the reception as well as for the transmission.

It is noted that "the two-way communication" stated herein becomes single-conductor two-way transmission in which the millimeter wave signal transmission path 9 as a transmission channel for a millimeter wave is one system (single-conductor). A half-duplex system to which Time Division Duplex ("TDD") is applied, Frequency Division Duplex ("FDD"), or the like is applied to the realization for "the two-way communication."

In the case of the time division duplex, the separation of the transmission and the reception is carried out in a time division manner. Thus, the simultaneity of the two-way communication or single-conductor simultaneous two-way transmission in which the signal transmission from the first communication apparatus 100X to the second communication apparatus 200X, and the signal transmission from the second communication apparatus 200X to the first communication apparatus 100X are simultaneously carried out is not realized, but the single-conductor simultaneous two-way transmission is realized by utilizing the frequency division duplex. However, since in the frequency division duplex, different frequencies are used between the transmission and the reception, a transmission bandwidth of the millimeter signal transmission path 9 needs to be widened.

The semiconductor 103 is connected to the transmission path coupling portion 108. An antenna structure, for example, including an antenna coupling portion, an antenna terminal, a micro-strip line, an antenna and the like is applied to the transmission path coupling portion 108. It is noted that by applying a technique for directly forming the antenna in the chip, the transmission path coupling portion 108 can also be incorporated in the semiconductor chip 103.

The LSI functional portion 104 carries out main application control for the first communication apparatus 100X. Thus, for example, the LSI functional portion 104 includes a circuit for processing various kinds of signals which are desired to be transmitted to the other party, and a circuit for processing various kinds of signals which are received from the other party.

The signal generating section 107 converts the signal supplied from the LSI functional portion 104 into the millimeter wave signal, and carries out the control for the signal transmission through the millimeter wave signal transmission path 9.

Specifically, the signal generating section 107 includes a transmission-side signal generating portion 110 and a reception-side signal generating portion 120. The transmission portion, the communication portion on the transmission side is composed of the transmission-side signal generating portion 110 and the transmission path coupling portion 108, and the reception portion, the communication portion on the reception side, is composed of the reception-side signal generating portion 120 and the transmission path coupling portion 108.

For the purpose of signal-processing the input signal to generate the millimeter wave signal, the transmission-side signal generating portion 110 includes a multiplexing processing portion 113, a parallel-serial converting portion 114, a modulating portion 115, a frequency converting portion 116, and an amplifying portion 117. It is noted that the modulating portion 115 and the frequency converting portion 116 may be collected into one portion complying with a so-called direct conversion system.

For the purpose of signal-processing the millimeter wave electric signal received by the transmission path coupling portion 108 to generate the output signal, the reception-side signal generating portion 120 includes an amplifying portion 124, a frequency converting portion 125, a demodulating portion 126, a serial-parallel converting portion 127, and a unification processing portion 128. The frequency converting portion 125 and the demodulating portion 126 may be collected into one portion complying with the so-called direct conversion system.

The parallel-serial converting portion 114 and the serial-parallel converting portion 127 are both prepared for the case of a parallel interface specification using a plurality of signals for parallel transmission. Thus, the parallel-serial converting portion 114 and the serial-parallel converting portion 127 are both unnecessary in the case of a serial interface specification.

When there are a plurality kind of signals (which are taken to be N1 kinds of signals) each an object of communication in the millimeter waveband of the signals supplied from the LSI functional portion 104, the multiplexing processing portion 113 executes multiplexing processing such as the time division duplex, the frequency division duplex or the code division duplex, thereby collecting a plurality kind of signals into one system of signal. For example, a plurality kind of signals for each of which the high-speed property and the large-capacity property are both required are each made an object of transmission carried out in the form of the millimeter wave, and are collected into one system of signal.

In the time division duplex or the code division duplex, the multiplexing processing portion 113 is provided in a preceding stage of the parallel-serial converting portion 114, and collects a plurality of signals supplied from the LSI functional portion 104 into one system of signal which is in turn supplied to the parallel-serial converting portion 114. In the division duplex, the division duplex is provided a change-over switch for finely dividing a time with respect to a plurality kind of signals _@ (@: 1 to N1), thereby supplying a plurality kind of signals _@ to the parallel-serial converting portion 114 on the time division basis. A unification processing portion 228 for restoring the one system of signal obtained through the collection to the N1 systems of signals is provided on the second communication apparatus 200X side so as to correspond to the multiplexing processing portion 113.

In the case of the frequency division duplex, the signals need to be modulated with the different carrier frequencies to be converted into the signals having frequencies in frequency bands F_@ different from one another, thereby generating signals in the millimeter waveband. Also, the resulting millimeter wave signals using the different carrier frequencies need to be transmitted either in the same direction or in the reverse direction. For this reason, when the resulting millimeter wave signals, for example, are transmitted in the same direction, the parallel-serial converting portion 114, the modulating portions 115, the frequency converting portion 116, and the amplifying portions 117 are provided so as to correspond to a plurality kind of signals _@, and an addition processing portion (signal mixing portion) as the multiplexing processing portion 113 is provided in a subsequent stage of each of the amplifying portions 117. Also, all it takes is that a millimeter wave electric signal in a frequency band of F_1+ . . . +F_N1 after completion of the frequency multiplexing processing is supplied to the transmission path coupling portion 108. When the millimeter wave signals using the different carrier frequencies are transmitted in the same direction, a so-called coupler has to be used as the addition processing portion. A configuration may also be adopted such that the amplifiers 117 are disposed in the subsequent stage, the transmission path coupling portion 108 side, of the multiplexing processing portion 113 to be collected into one amplifier.

In the frequency division duplex through which a plurality system of signals are collected into one system of signal, the transmission bandwidth needs to be widened. When collecting a plurality system of signals into one system of signal through the frequency division duplex, and the full-duplex system in which different frequencies are used between the transmission. For example in FIG. 1, the system from the transmission side signal generating portion 110 side to the reception side signal generating portion 220 and the reception, the system from the transmission side generating portion 210 side to the reception side signal generating portion 120, are used in combination with each other, the transmission bandwidth needs to be further widened.

The parallel-serial converting portion 114 converts a parallel signal into a serial data signal, and supplies the resulting serial data signal to the modulating portion 115. The modulating portion 115 is one which modulates the signal as the object of the transmission, and supplies the resulting signal to the frequency converting portion 116. All it takes is that the modulating portion 115 modulates at least one of an amplitude, a frequency, and a phase with the signal as the object of the transmission. Also, a system of an arbitrary combination of modulations about the amplitude, the frequency and the phase can also be adopted.

For example, in the case of an analog modulation system, for example, there are Amplitude Modulation (AM) and vector modulation. With regard to the vector modulation, there are Frequency Modulation (FM) and Phase Modulation (PM). On the other hand, in the case of a digital modulation system, for example, there are Amplitude Shift Keying (ASK), Frequency Shift Keying (FSK), Phase Shift Keying (PSK), and Amplitude Phase Shift Keying (APSK) for modulating both an amplitude and a phase. The amplitude phase modulation is typified by Quadrature Amplitude Modulation (QAM).

The frequency converting portion 116 frequency-modulates a signal as an object of transmission after having been modulated by the modulating portion 115 to generate a millimeter wave electric signal which is in turn supplied to the high-frequency amplifying portion 117. The millimeter wave electric signal points to an electric signal having a frequency in the range of about 30 to about 300 GHz. The reason for describing "about" in the frequency range is based on the fact that such a frequency as to obtain the effect by the millimeter wave communication in another embodiment is available, and a lower limit is not limited to 30 GHz and an upper limit is not limited to 300 GHz.

Although various kinds of circuit configurations can be adopted for the frequency converting portion 116, for example, all it takes is that a configuration including a frequency mixing circuit, mixer circuit and a local oscillator is adopted. The local oscillator generates a carrier, a carrier signal or a reference carrier, used for the modulation. The frequency mixing circuit multiples or modulates a carrier in the millimeter waveband generated by the local oscillator by the signal supplied from the parallel-serial converting portion 114 to generate a modulated signal in the millimeter waveband, and supplies the resulting modulated signal to the amplifying portion 117.

The amplifying portion 117 amplifies the millimeter wave electric signal after having been frequency-converted, and supplies the millimeter wave electric signal thus amplified to the transmission path coupling portion 108. The amplifying portion 117 is connected to the two-way transmission path coupling portion 108 through an antenna terminal (not shown).

The transmission path coupling portion 108 transmits the millimeter wave signal generated by the transmission-side signal generating portion 110 to the millimeter wave signal transmission path 9. Also, the transmission path coupling portion 108 receives the millimeter wave signal from the millimeter wave signal transmission path 9, and outputs the millimeter wave signal to the reception side signal generating portion 120.

The transmission path coupling portion 108 is composed of an antenna coupling portion. The antenna coupling portion can be part of the transmission path coupling portion 108, the signal coupling portion. The antenna coupling portion narrowly points to a portion in which an electronic circuit formed within the semiconductor chip, and an antenna disposed either inside or outside the semiconductor chip are coupled to each other, and broadly points to a portion in which the semiconductor chip and the millimeter wave signal transmission path 9 are signal-coupled to each other. For example, the antenna coupling portion includes at least the antenna structure. In addition, when the transmission or reception is carried out on the time division duplex basis, an antenna switching portion, an antenna duplexer is provided in the transmission path coupling portion 108.

The antenna structure points to a structure in the coupling portion with the millimeter wave signal transmission path 9. Thus, all it takes is that the electric signal in the millimeter waveband is coupled to the millimeter wave signal transmission path 9 through the antenna structure, and thus the antenna structure does not mean only the antenna itself. For example, the antenna structure includes an antenna terminal, a micro-strip line, and an antenna. When the antenna switching portion is formed within the same semiconductor chip, the antenna terminal and the micro-strip line other than the antenna switching portion compose the transmission path coupling portion 108.

The antenna on the transmission side radiates an electromagnetic wave based on the millimeter wave signal to the millimeter wave signal transmission path 9. In addition, the antenna on the reception side receives the electromagnetic wave based on the millimeter wave signal from the millimeter wave signal transmission path 9. The micro-strip line is connected between the antenna terminal and the antenna, and the millimeter wave signal on the transmission side is transmitted from the antenna terminal to the antenna through the micro-strip line, and the millimeter wave signal on the reception side is transmitted from the antenna to the antenna terminal through the micro-strip line.

The antenna switching portion is used when the antenna is used for the reception as well as for the transmission. For example, when the millimeter wave signal is transmitted to the second communication apparatus 200X side as the other party, the antenna switching portion connects the antenna to the transmission-side signal generating portion 110. On the other hand, when the millimeter wave signal is received from the second communication apparatus 200X side as the other party, the antenna switching portion connects the antenna to the reception-side signal generating portion 120. Although the antenna switching portion is provided on the substrate 102 separately from the semiconductor chip 103, the present invention is by no means limited thereto, and thus the antenna switching portion may be formed within the semiconductor chip 103. When the antenna for transmission, and the antenna for the reception are provided separately from each other, the antenna switching portion can be omitted.

The millimeter wave signal transmission path 9 as a propagation path for the millimeter wave, for example, is expected to be structured as a free space transmission path in such a way that, for example, the millimeter wave is propagated through the space within the chassis. In addition, preferably, the millimeter wave signal transmission path 9 is structured in the form of a waveguide structure such as a waveguide, a transmission path, a dielectric line or an intra-dielectric transmission path. Also, the millimeter wave signal transmission path 9 has desirably the characteristics allowing the electromagnetic wave in the millimeter waveband to be efficiently transmitted. For example, it is better that the millimeter wave signal transmission path 9 is structured in the form of a dielectric transmission path 9A structured so as to contain a dielectric material having a relative permittivity in a given range, and a dielectric dissipation factor in a given range. For example, it is expected that the dielectric material is filled in the entire chassis, whereby the free space transmission path is not disposed, but the dielectric transmission path 9A is disposed between the transmission path coupling portion 108 and the transmission path coupling portion 208. In addition, it is also expected that a dielectric path as a linear member made of a dielectric material and having a certain wire diameter is connected between the antenna of the transmission path coupling portion 108 and the antenna of the transmission path coupling portion 208, thereby structuring the dielectric transmission path 9A.

With regard to "a given range," all it takes is that the relative permittivity or the dielectric dissipation factor of the dielectric material falls within such a range as to obtain the effect of the embodiment mode, and thus has a predetermined value in this sense. In other words, all it takes is that the dielectric material is one which has such characteristics as to obtain the effect of the embodiment mode, and with which the millimeter wave can be transmitted. Although the characteristics are not necessarily, clearly determined because the characteristics cannot be determined by the dielectric material itself, and are also related not only to the transmission path length, but also to the frequency of the millimeter wave, the characteristics are described as an example as follows.

For the purpose of transmitting the millimeter wave signal through the dielectric transmission path 9A at a high speed, it is preferable that the relative permittivity of the dielectric material is in the range of about 2 to about 10, more preferably, in the range of 3 to 6, and the dielectric dissipation factor of the dielectric material is in the range of about 0.00001 to about 0.01, more preferably, in the range of 0.00001 to 0.001. A dielectric material, for example, made of an acrylic resin system, an urethane resin system, an epoxy resin system, a silicon system, a polyimide system, or a cyanoacrylate resin system or the like can be used as the dielectric material meeting such conditions. Such ranges of the relative permittivity and the dielectric dissipation factor of the dielectric material also apply to other embodiments unless otherwise stated. It is noted that in addition to the dielectric transmission path 9A, a hollow waveguide in which the circumference of the transmission path is surrounded by a shielding material, and an inside of which is hollow may also be used as the millimeter wave signal transmission path 9 having the structure such that the millimeter wave signal is confined within the transmission path.

A reception-side signal generating portion 120 is connected to the transmission path coupling portion 108. The amplifying portion 124 on the reception side is connected to the transmission path coupling portion 108. Thus, the amplifying portion 124 amplifies the millimeter wave electric signal after having been received by the antenna, and supplies the millimeter wave electric signal thus amplified to the frequency converting portion 125. The frequency converting portion 125 frequency-converts the millimeter wave electric signal after having been amplified, and supplies the millimeter wave electric signal thus frequency-converted to the demodulating portion 126. The demodulating portion 126 demodulates the signal after having been frequency-converted to acquire a signal in a base-band, and supplies the signal in the base-band thus acquired to the serial-parallel converting portion 127.

The serial-parallel converting portion 127 converts the serial received data into parallel output data, and supplies the resulting parallel output data to the unification processing portion 128.

The unification processing portion 128 corresponds to the multiplexing processing portion 213 of the transmission side signal generating portion 210. For example, when there are a plurality (taken to be N2: whether or not N2 is different from N identical to N1 is no object) of signals each the object of the communication in the millimeter waveband in the signals supplied from the LSI functional portion 204, the multiplexing processing portion 213 executes the multiplexing processing such as the time division multiplexing, the frequency division multiplexing and the code division multiplexing, thereby collecting a plurality kind of signals into one system of signal similarly to the case of the multiplexing processing portion 113. When having received such signals from the second communication apparatus 200X, the unification processing portion 128 separates the one system of signal obtained through the collection into a plurality kind of signals _@ (@: 1 to N2) similarly to the case of the unification processing portion 228 corresponding to the multiplexing processing portion 113. In the case of the embodiment mode, for example, the unification processing portion 128 separates the N2 data signals which are collected into one system of signal into the individual data signals, and supplies the individual data signals thus separated to the LSI functional portion 104.

It is noted that when in the second communication apparatus 200X, there are a plurality kind (N2) of signals each the object of the communication in the millimeter waveband in the signals supplied from the LSI functional portion 204, a plurality kind (N2) of data signals are collected into one system of signal on the frequency division duplex basis in some cases. In such cases, the millimeter wave electric signal in the frequency band of F__1+ . . . +F_N2 after completion of the frequency duplex processing needs to be received and processed so as to correspond to the frequency bands F_@, respectively. For this reason, all it takes is that amplifying portions 124, frequency converting portions 125, demodulating portions 126, and serial-parallel converting portions 127 are provided so as to correspond to a plurality kind of signals _@, respectively, and a frequency separating portion is provided as a unification processing portion 128 in a preceding stage of each of the amplifying portions 124. Also, all it takes is that the millimeter wave electric signals in the respective frequency bands F_@ after completion of the separation are supplied to the systems in the frequency bands F_@, respectively. When the signal which is obtained by multiplexing the millimeter wave signals having the different carrier frequencies, respectively, is separated into the millimeter wave signals having the different carrier frequencies, respectively, a so-called distributor has to be used as the frequency separating portion. A configuration may also be adopted such that the amplifying portions 124 are disposed in the preceding stage, the transmission path coupling portion 208 side, of the unification processing portion 128 to be collected into one amplifying portion.

It is noted that although the form of use of the frequency division multiplexing system described herein is the system such that multiple sets of transmission portions and reception portions are used, and the millimeter wave signals are transmitted in the same direction, from the first communication apparatus 100X to the second communication apparatus 200X, by using the different carrier frequencies in the respective sets, the form of use of the frequency division multiplexing system is by no means limited thereto. For example, the full-duplex two-way communication can also be carried out as follows. That is to say, in FIG. 1, the first carrier frequency is used in a set of transmission-side signal generating portion 110 of the first communication apparatus 100X, and reception-side signal generating portion 220 of the second communication apparatus 200X. Also, the second carrier frequency is used in a set of reception-side signal generating portion 120 of the first communication apparatus 100X, and transmission-side signal generating portion 210 of the second communication apparatus 200X. Thus, the two sets carry out the signal transmissions simultaneously in directions opposite to each other. In this case, a so-called circulator with which the signal transmissions can be bi-directionally carried out at the same time has to be used as the antenna switching portion for the transmission path coupling portions 108 and 208.

In addition, a form may also be adopted such that the more sets of transmission portions and reception portions are used, and the same direction and the opposite direction are combined with each other by using the different carrier frequencies in the respective sets. In this case, all it takes is that a configuration is used such that the multiplexing processing portions 113 and 213, and the unification processing portions 128 and 228 are used while the circulator is used in each of the transmission path coupling portions 108 and 208.

In addition, it is also expected to adopt a system configuration such that various kinds of multiplexing systems are combined with one another, for example, the time division multiplexing is used in a part of the system, and the frequency division multiplexing is used in other part of the system.

When the semiconductor chip 103 is configured in the manner described above, the input signal is subjected to parallel-serial conversion to be transmitted to the semiconductor chip 203 side. Also, the received signal from the semiconductor chip 203 is subjected to serial-parallel conversion, thereby reducing the number of signals each as the object of the millimeter wave conversion.

The second communication apparatus 200X has approximately the same function and configuration as those of the first communication apparatus 100X with respect to other configurations, for example, as previously stated about the unification processing portion 228 in relation to the multiplexing processing portion 113, and as previously stated about the multiplexing processing portion 213 in relation to the unification processing portion 128. The individual functional portions are designated by reference numerals of 200s, respectively, and the functional portions identical or similar to those in the first communication apparatus 100X are designated by the same reference numeral as those in the first communication apparatus 100X, i.e., reference numerals 10s and 1s, respectively. A transmission portion is composed of a transmission side signal generating portion 210 and a transmission path coupling portion 208, and a reception portion is composed of a reception side signal generating portion 220 and the transmission path coupling portion 208.

The LSI functional portion 204 carries out main application control for the second communication apparatus 200X. Thus, the LSI functional portion 204, for example, includes a circuit for processing various kinds of signals which are desired to be transmitted to the other party, and a circuit for processing various kinds of signals which are received from the other party.

A technique for frequency-converting an input signal, and transmitting a resulting signal is generally used in the broadcasting and the wireless communication. In these use applications, there are used the relatively complicated transmitter, receiver and the like which can cope with problems such as a) how far the communication can be carried out (a problem about an S/N ratio against a thermal noise), b) how the configuration copes with the reflection and the multi-path, c) how a hindrance and an interference with other channels are suppressed, and so on. On the other hand, each of the signal generating sections 107 and 207 used in the wireless transmission system 1X of the embodiment mode is used in a millimeter waveband and having frequencies each of which is higher than the use frequency in the relatively complicated transmitter, receiver and the like generally used in the broadcasting and the wireless communication, and also a wavelength, $\lambda$, is shorter. Therefore, the frequencies are easy to reutilize, and thus each of the signal generating sections 107 and 207 is suitably for communications among many devices each two disposed in a short distance.

In the embodiment mode of the wireless transmission system 1X, unlike the signal interface utilizing the existing electric wiring, the signal transmission is carried out in the millimeter waveband as described above, thereby making it possible to flexibly respond to both the high-speed property and the large-capacity property. For example, only the signal for which the high-speed property and the large-capacity property are both required is made the object of the communication in the millimeter waveband. Thus, each of the first communication apparatus 100X and the second communication apparatus 200X partially includes the interface (the connection by the terminal and the connector) by the existing electric wiring in order to respond to the signal having both the low-speed property and the small-capacity property, and the supply of the power source voltage depending on the system configurations.

The signal generating section 107 signal-processes the input signal inputted thereto from the LSI functional portion 104 to generate the millimeter wave signal. The signal generating section 107 is connected to the transmission path coupling portion 108 through the transmission line such as the micro-strip line, a strip line, a coplanar line or a slot line. Thus, the resulting millimeter wave signal is supplied to the millimeter wave signal transmission path 9 through the transmission path coupling portion 108.

The transmission path coupling portion 108 has the antenna structure, and has the function of converting the millimeter wave signal transmitted thereto into the electromagnetic wave, and sending the resulting electromagnetic wave. The transmission path coupling portion 108 is coupled to the millimeter wave signal transmission path 9, and thus the resulting electromagnetic wave obtained through the conversion in the transmission path coupling portion 108 is supplied to one end portion of the millimeter wave signal transmission path 9. The transmission path coupling portion 208 on the second communication apparatus 200X side is coupled to the other end portion of the millimeter wave signal transmission path 9. The millimeter wave signal transmission path 9 is provided between the transmission path coupling portion 108 on the first communication apparatus 100X side and the transmission path coupling portion 208 on the second communication apparatus 200X side, so that the electromagnetic wave in the millimeter waveband is propagated through the millimeter wave signal transmission path 9.

The transmission path coupling portion 208 on the second communication apparatus 200X side is coupled to the millimeter wave signal transmission path 9. The transmission path coupling portion 208 receives the electromagnetic wave transmitted to the other end portion of the millimeter wave signal transmission path 9, converts the electromagnetic wave thus received into the millimeter wave signal, and supplies the resulting millimeter wave signal to the signal generating section 207 (base-band signal generating portion). The signal generating section 207 signal-processes the millimeter wave signal obtained through the conversion to generate the output signal (base-band signal), and supplies the resulting output signal to the LSI functional portion 204.

Although in this case, the description has been given with respect to the case of the signal transmission from the first communication apparatus 100X to the second communication apparatus 200X, the case where the signal supplied from the LSI functional portion 204 of the second communication apparatus 200X is transmitted to the first communication apparatus 100X may be similarly considered. Thus, the millimeter wave signal can be transmitted bi-directionally.

Here, the signal transmission system in which the signal is transmitted through the normal electric wiring involves the following problems:

i) Although the large capacity and the increased high speed of the transmission data are both required, there is a limit to the transmission speed and the transmission capacity of the electric wiring.

ii) It is expected that for the purpose of coping with the problem about the increased high speed of the transmission data, the number of wirings is increased, and thus the transmission speed per one signal line is reduced by parallelization of signals. However, this case leads to an increase of the number of input/output terminals. As a result, there are required the complexity of the printed wiring board and the cable wiring, the increase of each of the physical sizes of the connector portion and the electric interface, and the like. Thus, there is caused a problem that the shapes of the printed wiring board and the cable wiring, and the connector portion and the electric interface are complicated, the reliabilities thereof are reduced, and the cost is increased.

iii) A problem about the electromagnetic compatibility (EMC) is further actualized as the band of the base-band signal becomes wider along with the increased enormousness of an amount of information such as a film and a video, and a computer image. For example, when the electric wiring is used, the wiring acts as the antenna, and thus the signal corresponding to the tuning frequency of the antenna is interfered. In addition, the factors caused by the reflection and the resonance due to the mismatching or the like of the impedance of the wiring also cause the unnecessary radiation. In order to cope with such a problem, the configuration of the electronic apparatus is necessarily completed.

iv) In addition to the EMC, when the reflection is caused, the transmission error due to the interference between the symbols, and the transmission error due to the unsolicited hindrance also becomes a problem on the reception side.

The embodiment of the wireless transmission system 1X carries out the signal transmission by using the millimeter wave without using the electric wiring. The signal intended to be transmitted from the LSI functional portion 104 to the LSI functional portion 204 is converted into the millimeter wave signal, and the resulting millimeter wave signal is transmitted between the transmission path coupling portions 108 and 208 through the millimeter wave transmission path 9.

Owing to the wireless transmission, it is unnecessary to worry about the wiring shape and the position of the connector. Therefore, a limit to the layout is not generated so much. Since for the signal which is transmitted in the form of the millimeter wave instead of being transmitted through the electric wiring, the wiring and the terminal can be omitted. As a result, the problems about the EMC are solved. In general, any of functional portions each using the frequency in the millimeter base-band does not exist somewhere else in the insides of the first and second communication apparatuses 100X and 200X. As a result, the measures taken to cope with the EMC can be readily realized.

The following advantages are obtained because of the wireless transmission in the state in which the first communication apparatus 100X and the second communication apparatus 200X are disposed in a short distance, and because of the signal transmission between the fixed positions and related to the known positional relationship.

1) It is easy to properly design the propagation channel, or the waveguide structure between the transmission side and the reception side.

2) The dielectric structure of the transmission path coupling portion which seals the transmission side and the reception side, and the propagation channel, such as the waveguide structure of the millimeter wave signal transmission path 9, are designed in combination with each other, whereby the transmission which is higher reliable and more excellent than that of the free space transmission becomes possible.

3) The control by the controller, the LSI functional portion 104 in the embodiment mode, for managing the wireless transmission also needs not to be dynamically, adaptively and frequently carried out as with the general wireless communication. Therefore, the overhead by the control can be reduced as compared with the general wireless communication. As a result, the miniaturization, the low power consumption and the high-speed operation become possible.

4) When the wireless transmission environment is corrected in the phase of the manufacture and in the phase of the design, and the dispersion and the like of the individual constituent elements are grasped, the transmission is carried out by referring to the resulting data, thereby making it possible to carry out the communication of the higher grade.

5) Even when the reflection exists, the influence of the reflection can be readily removed on the reception side by using a small equalizer because of the fixed reflection. The setting of the equalizer also can be carried out in accordance with the preset or the static control, and thus is easy to realize.

In addition, the following advantages are obtained because of the wireless communication in the millimeter waveband having the short wavelengths.

a) Since the communication band is widely obtained in the millimeter wave communication, it is possible to simply obtain the large data rate.

b) The frequencies used in the transmission can be each separated from other frequencies for the base-band signal processing. Thus, the interference in frequency between the millimeter wave and the base-band signal is hardly caused.

c) Since the wavelength is short in the millimeter waveband, it is possible to miniaturize the antenna and the waveguide structure each depending on the wavelength. In addition thereto, the electromagnetic shielding is easy to carry out because the distance attenuation is large and the difference is less.

d) In the normal wireless communication in the field, the severe regulations are set for the stability of the carrier in order to prevent the interference or the like. For the purpose of realizing such a carrier having the high stability, outside frequency standard parts or components, a multiplying circuit, a phase-locked loop (PLL) circuit, and the like each having the high stability are used, and thus the circuit scale becomes large. However, in the millimeter wave, especially, in the phase of being combined with the signal transmission between the fixed positions, or related to the known positional relationship, the millimeter wave can be readily shielded, and can be prevented from being leaked to the outside. Also, the carrier having the low stability can be used in the transmission and the increase of the circuit scale can be suppressed. In order to demodulate the signal which is transmitted with the carrier having the lowered stability by the small circuit on the reception side, the injection-locked system is preferably adopted.

It is noted that although in the embodiment mode, the wireless transmission system 1X for carrying out the communication in the millimeter waveband is exemplified as the wireless transmission system, the application range of the wireless transmission system is by no means limited to the communication in the millimeter waveband. The wireless transmission system may also be applied as a communication in a frequency band falling below the millimeter waveband, or contrary to this, in a frequency band exceeding the millimeter waveband. For example, the microwave band may also be applied.

Figure 2B:
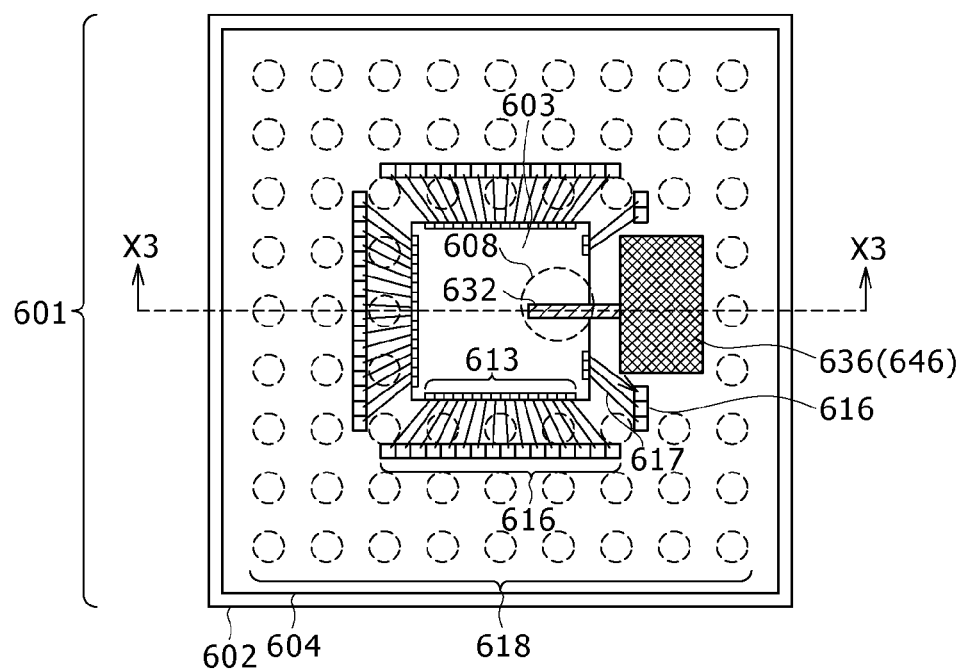
Figure 2C:
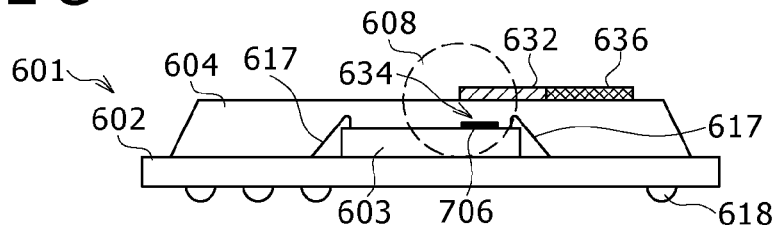

FIGS. 2A to 2C are respectively views explaining a basic structure of an embodiment of a semiconductor package 601 (semiconductor device) according to principles of the present invention. FIG. 2A is a perspective view showing an entire outline of the semiconductor package 601, FIG. 2B is a top plan view of the semiconductor package 601, and FIG. 2C is a cross sectional view taken on line X3-X3 of FIG. 2B.

The semiconductor package 601 according to principles of the present invention is structured in such a way that the semiconductor chip 103 and semiconductor chip 203 described above, collectively described as a semiconductor chip 603, are accommodated in a resin mold. In this case, the semiconductor chip 603 is not directly mounted to a circuit substrate (the substrate 102, 202 described above), but the semiconductor package 601 in which the semiconductor chip 603 is mounted to an interposer substrate, and is then molded with a resin, such as an epoxy resin is mounted to the circuit substrate.

The semiconductor chip 603 executes the communication processing in the millimeter band. As previously described with reference to FIG. 1, the semiconductor chip 603 is used as the system LSI in which the LSI functional portion 104 and the signal generating section 107, or the LSI functional portion 204 and the signal generating section 207 are integrated with each other. The semiconductor package 601 is normally used in the form of being mounted to a surface of a mounting board such as a printed wiring board.

Specifically, the semiconductor package 601 includes an interposer substrate 602, the semiconductor chip 603 to which the communication processing in the millimeter band can be applied, an encapsulation resin 604, and a millimeter wave coupling structure 608, for example a high-frequency signal coupling structure: corresponding to the transmission path coupling portion 108, 208. Although the millimeter wave coupling structure 608 can respond to any of a single end output and a differential output, in the following description, the millimeter wave coupling structure 608 is described as one responding to the single end output unless the special notice is made for the sake of simplicity of the description.

The interposer substrate 602 composes a chip mounting substrate, and the semiconductor chip 603 is mounted to the interposer substrate 602. A sheet member which is obtained by combining a heat reinforcement region having a relative permittivity in a given range, of about 2 to about 10, and a copper foil with each other has to be used in the interposer substrate 602.

A portion in which a plurality of pad electrodes 613 are formed similarly to the case of the existing structure exists on a surface of the semiconductor chip 603. Also, a portion of a millimeter wave coupling structure 608 for millimeter wave wireless transmission (millimeter wave coupling structure) inherent in the structure of the embodiment mode exists on the surface of the semiconductor chip 603. In a word, the terminals of the power source portion and the like each being not the object of the transmission using the millimeter wave signal are connected in the same manner as that in the existing structure.

For example, lead electrodes 616 corresponding to pad electrodes 613 of the semiconductor chip 603, respectively, are provided on a surface such as the front surface, on the side of the interposer substrate 602 to which the semiconductor chip 603 is mounted. The pad electrodes 613 and the lead electrodes 616 are connected to one another through the bonding wires 617, respectively. A plurality of terminal electrodes 618 are provided on a back surface side of the interposer substrate 602. The terminal electrodes 618 are terminals for electrical connection to the mounting circuit substrate (the substrate 102, 202) to which the semiconductor package 601 is applied. Thus, for example, solder balls are used as the terminal electrodes 618. The terminal electrodes 618 are in a use application such as input/output of the electric signals, such as the control signals for the semiconductor chip 603, each not being the object of the millimeter wave transmission such as the power source, the grounding, and the millimeter wave transmission.

With the interposer substrate 602, the pad electrodes 613 and the terminal electrodes 618 are connected to one another through the lead electrodes 616 and the bonding wires 617, respectively. For example, the lead electrodes 616 are connected to the terminal electrodes 618 through a wiring pattern within the interposer substrate 602.

It is noted that a method of connecting the semiconductor chip 603 and the interposer substrate 602 to each other is by no means limited to the method of connecting the semiconductor chip 603 and the interposer substrate 602 to each other by using the bonding wires 617. In addition thereto, for example, there is a method using a lead frame or flip chip joining. The method using the flip chip joining is such that bump electrodes or solder balls are provided on both the back surface of the semiconductor chip 603, and the front surface of the interposer substrate 602, and the semiconductor chip 603 is connected to the interposer substrate 602 through the solder balls.

A signal line, of the semiconductor chip 603, as the object of the millimeter wave wireless transmission is coupled to the millimeter wave coupling structure 608. For example, a transmission path 706 for the high-frequency signal is provided through extension from the signal wiring of the electric circuit of the semiconductor chip 603. The transmission path 706 is formed in the same process as that for formation of the circuit wiring of the semiconductor chip 603. In other words, the transmission path 706 is formed integrally with the semiconductor chip 603. The semiconductor chip 603 is encapsulated with an encapsulation resin 604, an encapsulation member. A conductor layer (not shown) is formed either on the semiconductor chip 603 side, in a boundary with the semiconductor chip 603 of the encapsulation resin 604 or on a surface of the encapsulation resin 604 on a side opposite to the semiconductor chip 603. Also, a millimeter wave coupling structure 608 with a slot structure as a base is formed in a position of the encapsulation resin 604 corresponding to the transmission path 706.

In other words, this structure is such that the millimeter wave coupling structure 608 with the slot structure as the base is formed in the position corresponding to the transmission path 706 by utilizing the encapsulation resin 604 which encapsulates the semiconductor chip 603. A structure for transmitting the electromagnetic wave based on the high-frequency signal is realized between the transmission path 706 of the millimeter wave coupling structure 608, and the millimeter wave coupling structure 608 through the electromagnetic coupling of the high-frequency signal in the millimeter wave coupling structure 608. The details of the millimeter wave coupling structure 608 will be described later.

Package structural elements including portions of the semiconductor chip 603 and the millimeter wave coupling structure 608 on the interposer substrate 602 are covered with the encapsulation resin 604 as an example of an insulating member to be encapsulated.

A transmission path 632 is formed on a surface of a portion of the encapsulation resin 604 corresponding to the millimeter wave coupling structure 608, and an antenna structure 636 connected to the transmission path 632 is also formed on the surface of the portion of the encapsulation resin 604 corresponding to the millimeter wave coupling structure 608. The transmission path 632 has a function of transmitting the millimeter wave signal to the antenna structure 636 side, and the antenna structure 636 has a function of radiating the millimeter wave in the form of an electromagnetic signal wirelessly.

It is expected for the antenna structure 636 that with regard to a typical example, a pattern of a conductor, such as metal, is formed in a predetermined shape on the surface of the encapsulation resin 604, thereby structuring the antenna. For example, a patch antenna, an inverted F antenna or the like is a typical example. For example, it is expected as a method of forming an antenna pattern on the surface of the encapsulation resin 604 that the plating is made for the surface of the encapsulation resin 604, a conductor plate is selectively etched away after having been stuck to the surface of the encapsulation resin 604, a sticker having a metallic pattern formed thereon is stuck to the surface of the encapsulation resin 604, and so forth. In addition thereto, for example, a waveguide structure is adopted by utilizing the slot coupling, and so forth. In a word, this means that the antenna structure 636 obtained by application of a small aperture coupling element, such as the slot antenna, is made to function as a coupling portion of a waveguide. The details of the antenna structure 636 will be described later.

An epoxy resin, for example is used as the encapsulation resin 604. For example, the semiconductor chip 603 and the bonding wires 617 which are mounted to the interposer substrate 602 are encapsulated with the encapsulation resin 604. The encapsulation resin 604 is a dielectric material, and the original purpose thereof is to mainly protect the semiconductor chip 603 and the wiring made by the bonding wires 617 which are provided inside the semiconductor package 601.

In the embodiment mode of the semiconductor package 601, the encapsulation resin 604 functions as a millimeter wave transmission medium based on the electromagnetic coupling in the millimeter wave coupling structure 608 in addition to this original purpose thereof. For example, the millimeter wave coupling structure 608 in this case is composed of the semiconductor chip 603, the transmission path 632 provided on the encapsulation resin 604, and the millimeter wave transmission medium 634 made of the encapsulation resin 604 formed between the semiconductor chip 603 and the transmission path 632. The semiconductor chip 603 and the transmission path 632 on the surface of the encapsulation resin 604 compose the millimeter wave coupling structure 608. Thus, the millimeter wave transmission is carried out between the encapsulation resins 604 through the millimeter wave transmission medium 634 composing a part of the millimeter wave coupling structure 608 made from the encapsulation resin 604.

The semiconductor package 601 in which the semiconductor chip 603 which carries out the wireless transmission by using the millimeter wave signal, and which is encapsulated with the encapsulation resin 604 includes the millimeter wave coupling structure 608 through which the millimeter wave signals are electromagnetically coupled to each other on the semiconductor chip 603 and the surface of the encapsulation resin 604. Also, in the semiconductor package 601, the antenna structure 636 having the pattern having the predetermined shape is formed on the surface of the encapsulation resin 604.

As described above, the embodiment mode of the semiconductor package 601 includes the millimeter coupling structure 608 (high-frequency coupling structure) and the conductor antenna structure 636. In this case, the millimeter coupling structure 608 is provided between the terminals, each as the object of the transmission of the millimeter wave signal, of the semiconductor chip 608, and the surface of the encapsulation resin 604. Also, the conductor antenna structure 636 is provided on the surface of the encapsulation resin 604. The millimeter wave signal is transmitted between the semiconductor chip 603 and the transmission path 632 through the electromagnetic coupling formed in the portion of the millimeter transmission medium 634 between the semiconductor chip 603 and the transmission path 632 of the millimeter wave coupling structure 608. Also, the millimeter wave signal is radiated from the antenna structure 636.

According to the embodiment mode of the semiconductor package 601, a part of the terminal electrodes 618 of the semiconductor package 601 is replaced with the millimeter coupling structure 608. As a result, the number of terminal electrodes 618 can be reduced.

In addition thereto, the semiconductor package 601 adopts the millimeter wave coupling structure 608 as described above, whereby the antenna structure 636 can be formed on the surface of the package or the encapsulation resin 604 without having the special structure in the circumference of the semiconductor chip 603, and thus the miniaturization of the semiconductor package 601 can be realized. In addition, the general-purpose process can be applied, and the enhancement of the reliability by the encapsulation resin 604 can also be realized.

That is to say, the embodiment mode of the millimeter wave coupling structure 608 is integrated with the encapsulation resin 604. Thus, the package size is prevented from being made large unlike each of the structures which are described in Patent Documents 1 and 2, respectively, and in each of which the various kinds of structural elements are disposed outside the chip. In addition, the millimeter wave coupling structure 608 is structured by interposing the millimeter wave transmission medium 634 utilizing the encapsulation resin 604 between the terminals each as the object of the transmission of the millimeter wave signal of the semiconductor chip 603, and the surface of the encapsulation resin 604. Thus, the millimeter wave coupling structure 608 has an advantage that the structure is simpler than that of the case of Patent Document 1, and thus can be realized at a low cost. Since the millimeter wave coupling structure 608 is not such a structure that the millimeter wave signal is transmitted through the millimeter structure via the wires and the vias, it can be said that the transmission characteristics are not feared to be deteriorated as compared with the case of the structure described in Patent Document 1.

The antenna structure 636 in the embodiment mode of the semiconductor package 601 is not formed on the substrate, but is formed on the surface of the encapsulation resin 604. Therefore, the antenna pattern can be changed after completion of the manufacture of the semiconductor package 601. For example, when the plating is made for the surface of the encapsulation resin 604 or the conductor plate is selectively etched away after having been stuck to the surface of the encapsulation resin 604, the same problem as that in the case of Patent Document 1 may be caused. However, when the sticker having the metallic pattern formed thereon is stuck to the surface of the encapsulation resin 604, the antenna pattern can be changed by swapping the sticker.

Figure 3A:
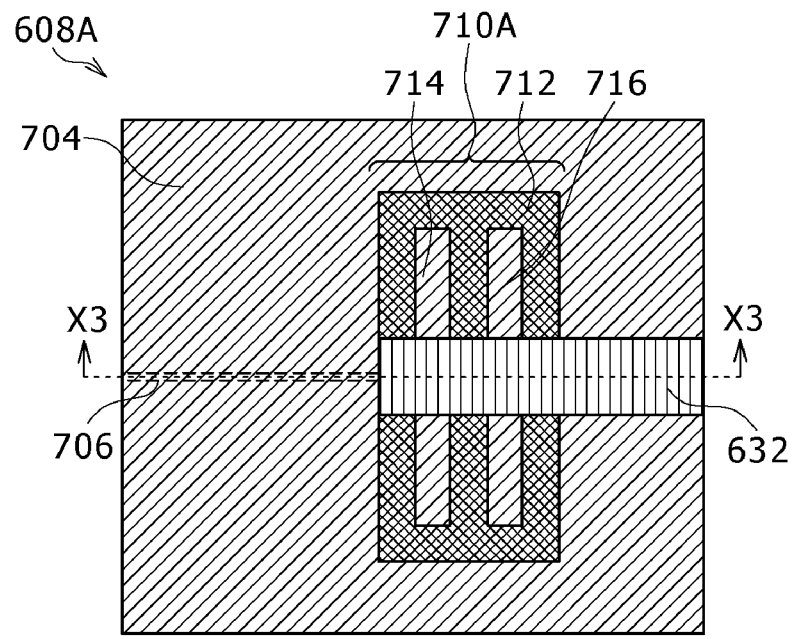
FIGS. 3A and 3B are respectively a top plan view showing a structure of a millimeter wave coupling structure according to a first embodiment of the semiconductor package according to principles of the present invention, and a cross sectional view taken on line X3-X3 of FIG. 3A.
Figure 3B:
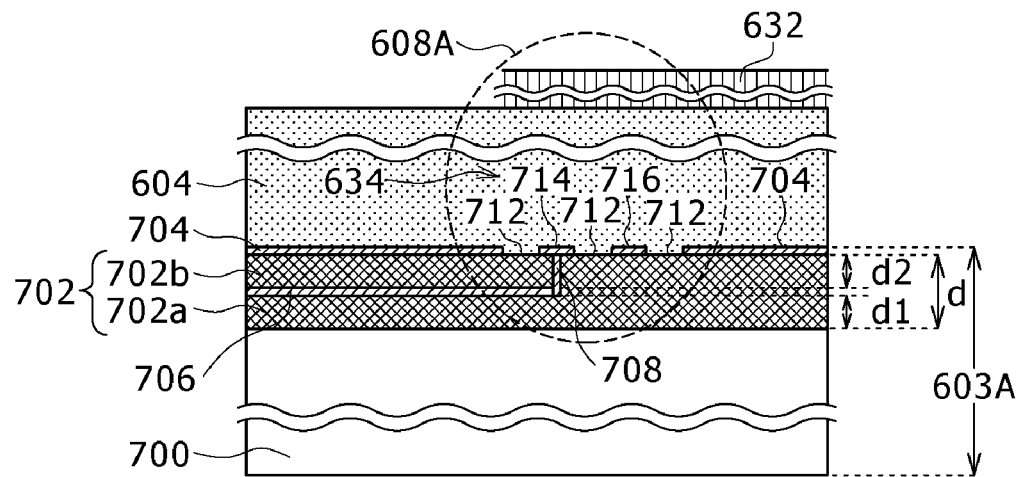
Figure 4A:
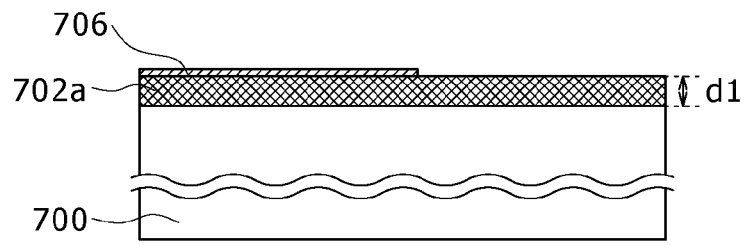
FIGS. 4A to 4C are respectively cross sectional views explaining a method of manufacturing the first embodiment of the semiconductor package according to principles of the present invention.
Figure 4B:
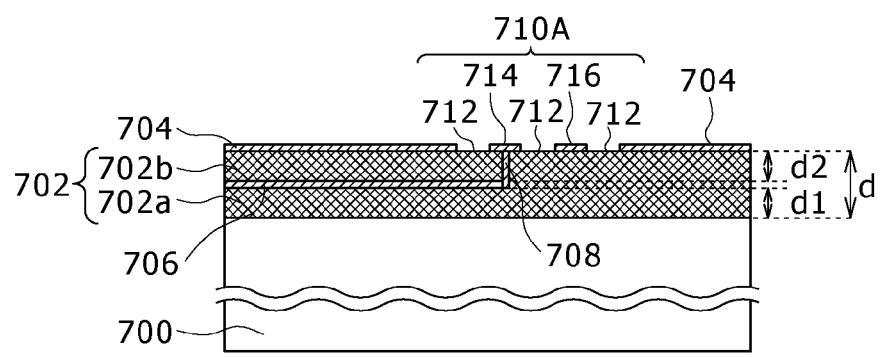
Figure 4C:
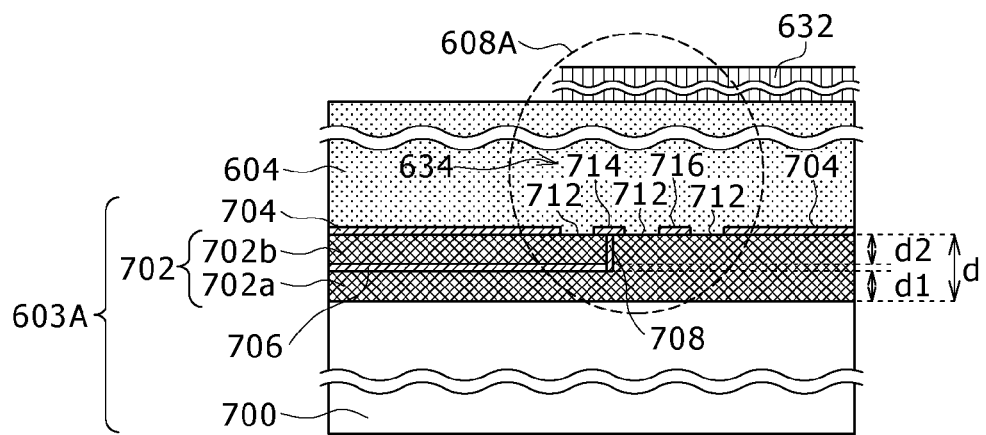
Figure 5A:
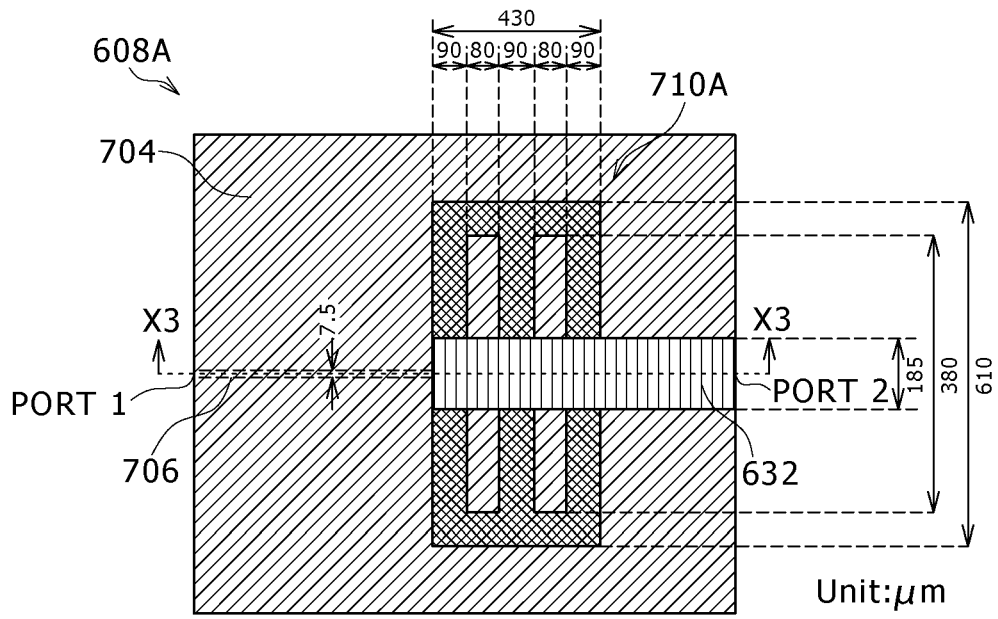
FIGS. 5A and 5B are respectively a top plan view explaining a size example of the millimeter wave coupling structure shown in FIGS. 3A and 3B, and a cross sectional view taken on line X3-X3 of FIG. 5A.
Figure 5B:
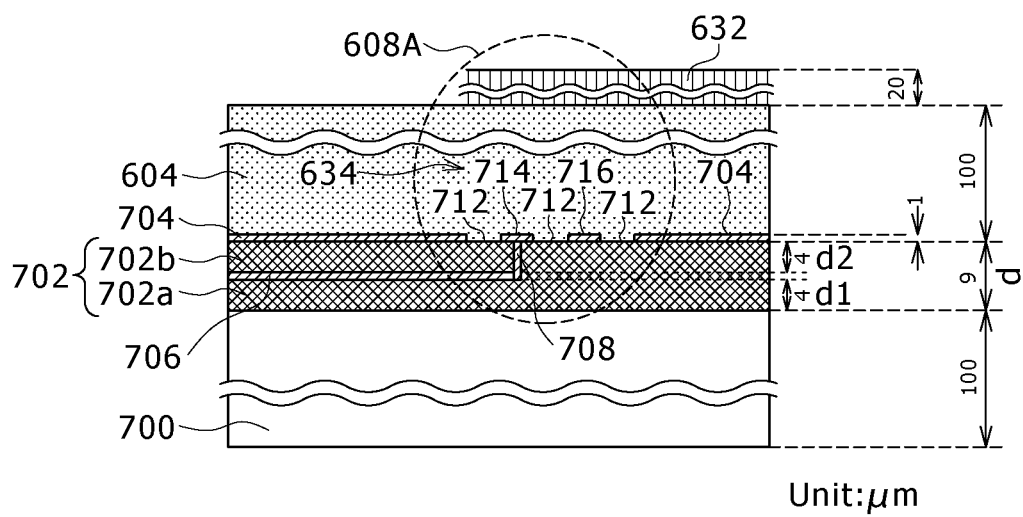
Figure 6:
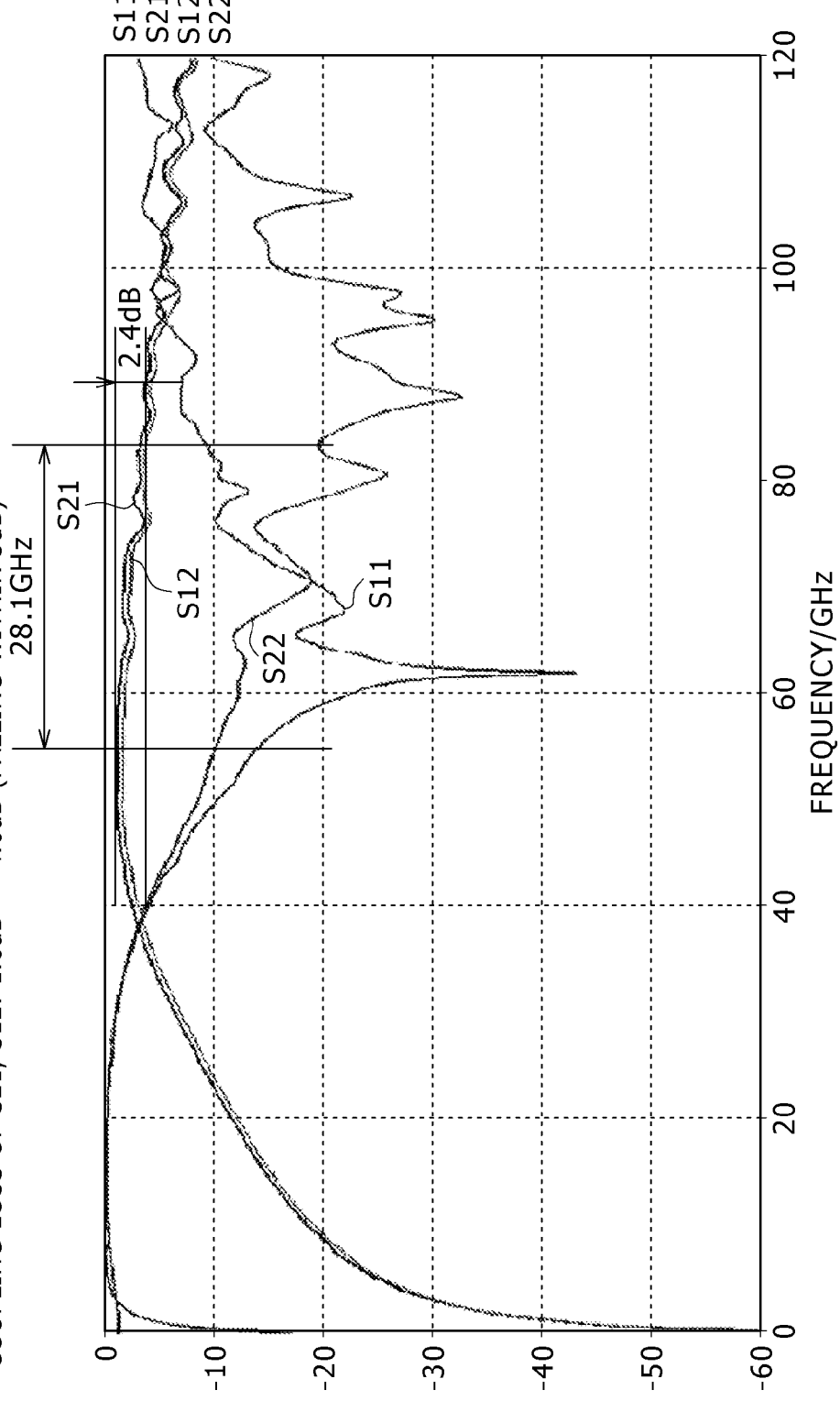
FIG. 6 is a graph explaining simulation characteristics in the case of the size example of the millimeter wave coupling structure shown in FIGS. 5A and 5B.

FIGS. 3A and 3B to FIGS. 7A to 7D are respectively views explaining a first embodiment of the semiconductor package 601 and especially, the millimeter wave coupling structure 608. FIGS. 3A and 3B are respectively a top plan view showing a structure of a millimeter wave coupling structure 608A according to the first embodiment of the semiconductor package 601, and a cross sectional view taken on line X3-X3 of FIG. 3A. FIGS. 4A to 4D are respectively cross sectional views explaining a method of manufacturing the first embodiment of the semiconductor package 601 and the millimeter wave coupling structure 608A. FIGS. 5A and 5B are respectively a top plan view explaining a size example of the millimeter wave coupling structure 608A shown in FIGS. 3A and 3B, and a cross sectional view taken on line X3-X3 of FIG. 5A. FIG. 6 is a graph explaining simulation characteristics in the case of the size example shown in FIGS. 5A and 5B. Also, FIGS. 7A to 7D are respectively top plan views explaining first to fourth structural examples of the antenna structure 636 (the antenna pattern 646) used in the first embodiment of the millimeter wave coupling structure 608A.

The first embodiment of the millimeter wave coupling structure 608A functioning as the transmission path coupling portion 108, 208 includes a conductor pattern having a slot structure and a micro-strip line as main portions. In this case, the conductor pattern having the slot structure is formed between the encapsulation resin 604 and a semiconductor chip 603A. Also, the micro-strip line is formed on the surface of the semiconductor chip 603A. The transmission path 632 formed inside a dielectric layer provided on an upper layer side of the semiconductor chip 603A is coupled to the antenna pattern composing the antenna structure 636 formed on the surface of the encapsulation resin 604 through the millimeter wave transmission medium 634 having the slot structure.

A dielectric layer 702 having a thickness, d, is formed on a silicon layer 700 or semiconductor layer. The dielectric layer 702, for example, is made from an oxide film. A conductor layer 704 is formed on a surface of the dielectric layer 702, and the encapsulation resin 604 is formed so as to cover the conductor layer 704.

A slot pattern structure 710A is formed in a part of the conductor layer 704. A portion extending from the silicon layer 700 to the conductor layer 704 in FIG. 3B is the semiconductor chip 603A. A transmission path 706, for the transmission of a signal, such as a high-frequency signal extending from a signal wiring (not shown) is inserted into a portion, having a thickness, d1, within the dielectric layer 702 from the silicon layer 700. The transmission path 632 is formed inside the dielectric layer 702 provided on the surface side of the semiconductor chip 603A.

The slot pattern structure 710A is composed of an opening portion 712 formed in the conductor layer 704, and long conductor patterns 714 and 716 which are surrounded by the opening portion 712 and which are disposed in parallel with each other. A via hole 708 is formed in the dielectric layer 702 so as to be electrically connected to an end portion of the transmission path 706. Also, the conductor pattern 714, of the slot pattern structure 710A, formed on the surface of the dielectric layer 702 is electrically connected to the via hole 708. A technique for forming the dielectric layer 702, and the conductor patterns 714 and 716 of the slot pattern structure 710A may be the same as a process for forming a conductor pattern for circuit wirings, such as a metal wiring process, on the silicon layer 700 composing the semiconductor chip 603A having a CMOS configuration. Thus, the dielectric layer 702, and the conductor patterns 714 and 716 of the slot pattern structure 710A are formed concurrently with formation of the conductor pattern for the circuit wirings.

The encapsulation resin 604 is formed over the semiconductor chip 603A (the conductor layer 704), and the transmission path 632 is formed on the surface of the encapsulation resin 604. Also, the transmission path 632 is connected to the antenna structure 636 (not shown).

Although as also previously stated, the encapsulation resin 604 is generally applied to the purpose of fixing the bonding wires 617 or enhancing the chip reliability, in this structure, the encapsulation resin 604 has the function as well of transmitting the electromagnetic wave in the portion of the millimeter wave coupling structure 608.

An epoxy resin, for example, is used as the encapsulation resin 604. For example, the semiconductor chip 603A and the bonding wires 617 mounted to the interposer substrate 602 are encapsulated with the encapsulation resin 604. The encapsulation resin 604 is made of the dielectric material, and the original encapsulation purpose thereof is to mainly protect the semiconductor chip 603A and the wirings based on the bonding wires 617 which are provided inside the semiconductor package 601.

In the first embodiment of the millimeter wave coupling structure 608A, the encapsulation resin 604 also functions as a millimeter wave transmission medium based on the electromagnetic coupling in the millimeter wave coupling structure 608A in addition to this original purpose thereof. For example, the millimeter wave coupling structure 608A in this case is composed of the semiconductor chip 603A, the transmission path 632 provided the surface of on the encapsulation resin 604, and the millimeter wave transmission medium 634 made of the encapsulation resin 604 formed between the semiconductor chip 603A and the transmission path 632. The semiconductor chip 603A and the transmission path 632 on the surface of the encapsulation resin 604 compose the millimeter wave coupling structure 608A. Thus, the millimeter wave transmission is carried out between the encapsulation resins 604 through the millimeter wave transmission medium 634 composing a part of the millimeter wave coupling structure 608A made from the encapsulation resin 604.

In such a millimeter wave coupling structure 608A, firstly, the dielectric layer 702, the conductor layer 704, and the transmission path 706 form the strip line transmission path made by carrying out the CMOS process. The via hole 708, and the conductor patterns 714 and 716 are formed in the CMOS process, and the conductor pattern 714 is connected to the transmission path 706 through the via hole 708.

The conductor layer 704, the encapsulation resin 604, and the transmission path 632 compose a micro-strip line (MS). As described above, the transmission path 632 is connected to the antenna structure 636 (not shown).

The slot pattern structure 710A radiates the electromagnetic wave. That is to say, with the millimeter wave coupling structure 608A having such a structure, for the millimeter wave signal, the transmission path 706 electrically connected to the signal wiring of the semiconductor chip 103 and the transmission path 632 formed on the surface of the encapsulation resin 604 are electromagnetically coupled to each other by the millimeter wave transmission wave transmission medium 634 formed in the encapsulation resin 604 between the transmission path 706 and the transmission path 632 through the slot pattern structure 710A. The electromagnetic wave radiated from the slot pattern structure 710A is strengthened by the conductor pattern 714 and the conductor pattern 716 composing the slot pattern structure 710A, and thus the broadband is realized.

It is noted that although a detailed description of the mechanism of the slot pattern structure 710A is omitted here for the sake of simplicity, for example, make reference to a non-patent literary document of Deal, W. R.; Radisic, V.; Yongxi Qian; Itoh, T., "A broadband microstrip-fed slot antenna," Technologies for Wireless Applications, 1999. Digest. 1999 IEEE MTT-S Symposium on Date: 21-24 Feb. 1999, pp. 209 to 212.

A method of manufacturing the first embodiment of the millimeter wave coupling structure 608A is as shown in FIGS. 4A to 4C.

Specifically, after the dielectric layer 702a is formed on the silicon layer 700 until a thickness thereof becomes d1, and the transmission path 706 is formed on the dielectric layer 702a (refer to FIG. 4A), the dielectric layer 702b made of the same material as that of the dielectric layer 702a is formed.

After that, the via hole 708 is formed in a portion corresponding to the end portion of the transmission path 706 of the dielectric layer 702. After that, after the conductor pattern composing the conductor layer 704 is formed on the entire surface of the dielectric layer 702 (702b), the opening portions 712 composing the slot pattern structure 710A are obtained by utilizing an etching method, thereby forming the conductor patterns 714 and 716 (refer to FIG. 4B).

A technique for forming the conductor layer 704, and the conductor patterns 714 and 716 of the slot pattern structure 710A may be used concurrently with the carrying-out of the process such as metal wiring process, for forming a conductor pattern for circuit wirings on the silicon layer 700 composing the semiconductor chip 603A having the CMOS configuration. Thus, there is an advantage that the conductor layer 704, and the conductor patterns 714 and 716 of the slot pattern structure 710A can be formed integrally with the conductor pattern for the circuit wirings.

However, as can be seen by making reference to a size example which will be described later, a width of each of the conductor patterns 714 and 716 of the slot pattern structure 710A is larger than that complying with the wiring rule, for example, several tens of micron-meters, of the CMOS process. Thus, it is feared that a drawback in manufacturing method due to the large size difference is caused.

After that, the encapsulation is carried out so as to cover the entire surface of the conductor layer 704 and the slot pattern structure 710A with the encapsulation resin 604. After that, the transmission path 632 and the antenna structure 636 (not shown) are formed on the surface of the encapsulation resin 604 (refer to FIG. 4C). The transmission path 632, for example, is formed integrally with the antenna structure 636 (the antenna pattern 646) by utilizing a method such as plating the etching after the sticking of the conductor plate, or the sticking of the sticker having the pattern formed thereon. When the sticker having the metallic pattern formed thereon is stuck to the surface of the encapsulation resin 604 in the manner as described above, there is an advantage that the antenna pattern can be changed by swapping the sticker.

FIGS. 5A and 5B show an example of the millimeter wave coupling structure 608A shown in FIGS. 3A and 3B. The silicon layer 700 has a thickness of 100 µm, and a permittivity of 11.7. The dielectric layer 702 has a thickness, d, of 9 µm, and a permittivity of 3.5. The transmission path 706 has a path thickness of 1 µm and a path width of 7.5 µm. The conductor layer 704 has a thickness of 1 µm. In this case, a characteristic impedance of the strip line transmission path composed of the dielectric layer 702, the conductor layer 704, and the transmission path 706 is designed to be 50Ω.

Each of the conductor patterns 714 and 716 of the slot pattern structure 710A has a conductor thickness of 1 µm, a transverse width of 80 µm, and a longitudinal width (length) of 380 µm. Thus, each of the conductor patterns 714 and 716 of the slot pattern structure 710A is structured in the form of the long conductor pattern. The opening portion 712 of the slot pattern structure 710A has a total width of 430 µm, a longitudinal width (length) of 610 µm, and a gap interval, an interval between the conductor patterns 714 and 716, or the like, of 90 µm.

The via hole 708 through which the transmission path 706 and the conductor pattern 714 are electrically connected to each other has a via diameter of 7.5 µm.

The encapsulation resin 604 has a dielectric thickness of 100 µm, and a permittivity of 4. The transmission path 632 formed on the surface of the encapsulation resin 604 has a path thickness of 20 µm, and a path width of 185 µm. In this case, a characteristic impedance of the micro-strip line (MSL) composed of the conductor layer 704, the encapsulation resin 604, and the transmission path 632 is designed to be 50Ω.

An example of simulation characteristics of the millimeter wave coupling structure 608A in the size example shown in FIGS. 5A and 5B will be described below with reference to FIG. 6. In this case, FIG. 6 shows a pass characteristic example and a reflection characteristic example obtained between ports 1 and 2 given to a simulation model of the millimeter wave coupling structure 608A shown in FIGS. 5A and 5B.

From the simulation characteristics shown in FIG. 6, 28.1 GHz, an amount in the range of 54.6 GHz to 82.7 GHz can also be used, is obtained as a band width meeting the reflection characteristics of S11<−10 dB, and the reflection characteristics of S22<−10 dB. Also, a coupling loss of each of the pass characteristics S21 and S12 is in the range of 1.6 dB to 4.0 dB or 1.6 dB to 3 dB By the way, paying attention to the pass characteristics S11 and S22, there is a difference between both peak positions of the pass characteristics S11 and S22. Although it is thought that this is a factor by which the band width is widened, in general, it is preferable that there is no difference between both the peak positions. It is thought that this difference is caused by the fact that a difference between the permittivities of the silicon layer 700 and the encapsulation resin 604 is large because the silicon layer 700 has the permittivity of 11.7 and the encapsulation resin 604 has the permittivity of 4, thereby providing the characteristics such that a part of the electromagnetic wave radiated from the slot pattern structure 710A to the transmission path 632 side is propagated toward the silicon layer 700 side.

For the purpose of avoiding the difference between both the peak positions of the pass characteristics S11 and S22, it is thought that the permittivity of the encapsulation resin 604 is made larger by, for example, containing a silicon filler in the dielectric material composing the encapsulation resin 604, and so forth. In this case, however, although the difference between both the peak positions of the pass characteristics S11 and S22 can be avoided, it is feared that conversely, the band width is narrowed. Therefore, all it takes is that the member (permittivity) of the encapsulation resin 604 is set in consideration of a balance between the difference between both the peak positions and the band width.

It is noted that since the material (permittivity) of the encapsulation resin 604 exerts an influence on the characteristic impedance as well of the micro-strip line (MSL) composed of the conductor layer 704 and the encapsulation resin 604 together, it becomes important to take this respect as well into consideration.

FIGS. 7A to 7D show first to fourth structural examples of the antenna structure 636, and the antenna pattern 646, used in the millimeter wave coupling structure 608A. In any of the first to fourth structural examples shown in FIGS. 7A to 7D, respectively, for the transmission path 632 having the characteristic impedance of 50Ω and formed on the surface of the encapsulation resin 604, an antenna pattern 646 having a conductor pattern having a predetermined shape is formed on the surface of the encapsulation resin 604, thereby structuring the antenna structure 636.

Figure 7A:
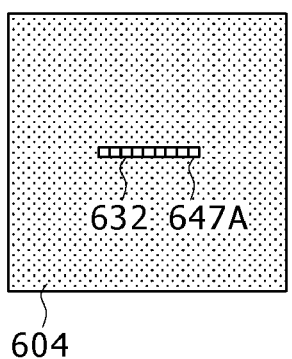
FIGS. 7A to 7D are respectively top plan views explaining first to fourth structural examples of the antenna structure used in the first embodiment of the millimeter wave coupling structure.

In the first structural example shown in FIG. 7A, there is structured a micro-strip antenna 647A using the end portion of the transmission path 632 as it is. In this case, a resonance structure is used to be made to function as the antenna. In other words, it can also be said that the micro-strip path is made to function as the antenna.

Figure 7B:
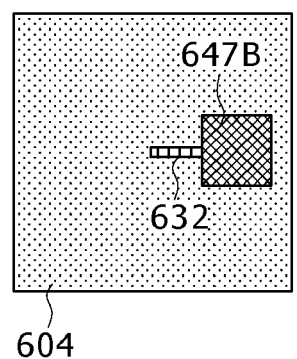

In the second structural example shown in FIG. 7B, there is structured a patch antenna 647B having a structure such that a transverse width of a path portion (strip portion) of the micro-strip antenna 647A is widened in order to further enhance the radiation efficiency of the electric wave as compared with the case of the micro-strip antenna 647A of the first structural example shown in FIG. 7A. It is noted that although in the second structural example shown in FIG. 7B, the patch antenna 647A has the quadrilateral shape or a rectangular shape, however, the present invention is by no means limited thereto, and thus the patch antenna 647B may also have a circular shape or any other suitable shape.

Figure 7C:
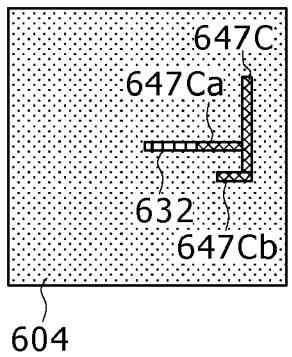

In the third structural example shown in FIG. 7C, there is structured a planar inverted F antenna 647C. A power feeding line 647Ca is connected to the transmission path 632, and a short-circuit line 647Cb is connected to a ground plane composed of the conductor layer 704 formed on the lower portion, on the surface of the semiconductor chip 603A, of the encapsulation resin 604.

Figure 7D:
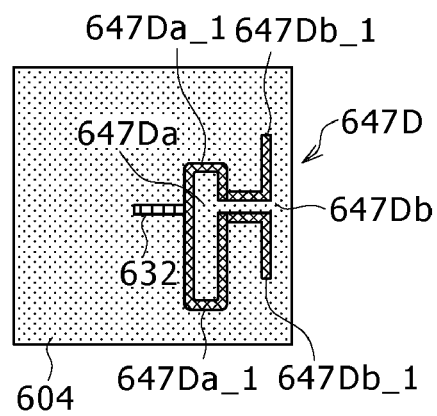

The fourth structural example shown in FIG. 7D shows a differential antenna 647D. The differential antenna 647D is composed of a combination of a phase shifter 647Da and a dipole antenna 647Db. The phase shifter 647Da includes phase shifters 647Da_1 and 647Da_2 which are different in path length from each other. A connection point between one end of the phase shifter 647Da_1 and one end of the phase shifter 647Da_2 is connected to the transmission path 632. The other end of the phase shifter 647Da_1 is connected to one element 647Db_1 of the dipole antenna 647Db, and the other end of the phase shifter 647Da_2 is connected to the other element 647Db_2 of the dipole antenna 647Db. The differential antenna 647D is set in such a way that a phase difference between the other end of the phase shifter 647Da_1 and the other end of the phase shifter 647Da_2 becomes 180° due to a difference in path length between the other end of the phase shifter 647Da_1 and the other end of the phase shifter 647Da_2.

Figure 8A:
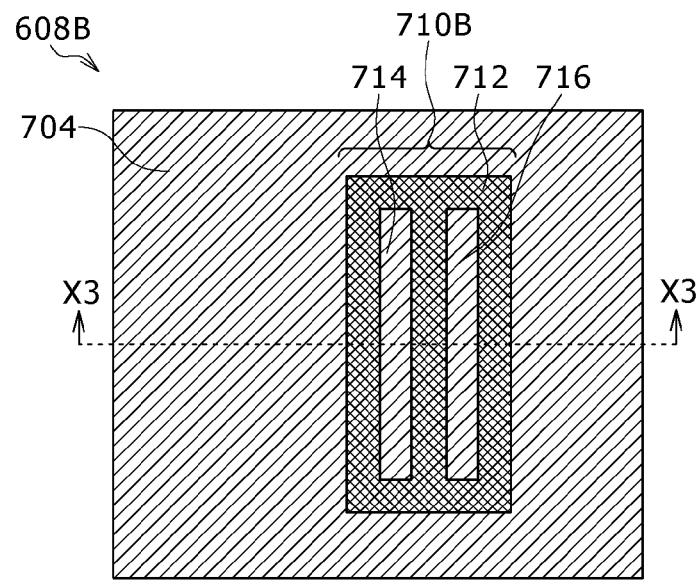
FIGS. 8A to 8C are respectively a top plan view of a portion of a slot pattern structure, a cross sectional view taken on line X3-X3 of FIG. 8A, and a cross sectional view of a portion of a semiconductor chip corresponding to the top plan view of FIG. 8A.
Figure 8B:
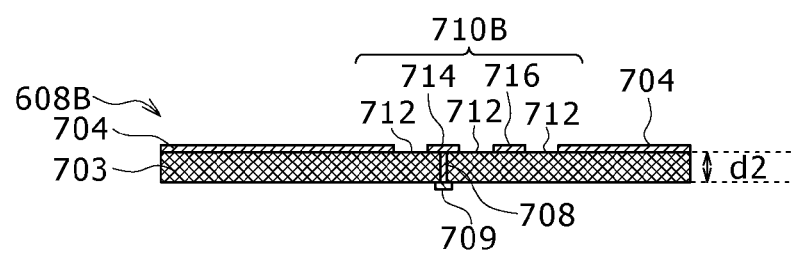
Figure 8C:
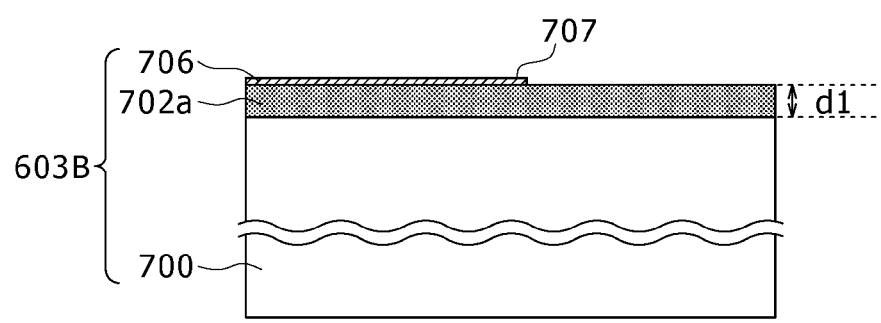

FIGS. 8A to 8C are respectively views explaining a change of the first embodiment of the semiconductor package 601 and a millimeter wave coupling structure 608. Also, FIGS. 8A to 8C are respectively views explaining a structure and a manufacturing method of the change, of first second embodiment of, a millimeter wave coupling structure 608B. That is to say, FIGS. 8A to 8C are respectively a top plan view of a portion of a slot pattern structure 710B, a cross sectional view taken on line X3-X3 of FIG. 8A, and a cross sectional view of a portion of a semiconductor chip 603B corresponding to the top plan view of FIG. 8A.

The millimeter wave coupling structure 608B is the change of the first embodiment of the millimeter wave coupling structure 608A. Thus, the millimeter wave coupling structure 608B of the change of the second embodiment has a form such that a portion of a slot pattern structure 710B is formed separately from a semiconductor chip 603B, and thereafter, the encapsulation resin 604, the transmission path 632, and the antenna structure 636 are formed after the slot pattern structure 710B and the semiconductor chip 603B are integrated with each other.

The millimeter wave coupling structure 608B of the change of the first embodiment has a structure such that the first embodiment of the millimeter wave coupling structure 608 is separated from the semiconductor chip 603B. Thus, in a state of a completed product, the millimeter wave coupling structure 608B of the change of the first embodiment is hardly different from the first embodiment of the millimeter wave coupling structure 608A. In a middle stage, however, as shown in FIGS. 8A to 8C, the feature of the change of the first embodiment is that the semiconductor chip 603B, and the millimeter wave coupling structure 608B having the slot pattern structure 710B as the main portion are formed separately from each other. That is to say, the feature means that the semiconductor chip 603B, and the millimeter wave coupling structure 608B, such as the slot pattern structure 710B are prepared separately from each other, and the millimeter wave coupling structure 608B is joined to the terminals on the semiconductor chip 603B, thereby obtaining a stack structure. By adopting this structure, there is obtained an advantage that the millimeter wave coupling structure 608B is free from the drawback in manufacturing method due to a size difference between the wiring rule, for example, several tens of micron-meters of the CMOS process and the conductor patterns 714 and 716 of the slot pattern structure 710A as described in the method of manufacturing the first embodiment of the millimeter wave coupling structure 608A.

The millimeter wave coupling structure 608B having the slot pattern structure 710B as the main portion, as shown in FIGS. 8A and 8B, has approximately the same structure as that of the slot pattern structure 710A of the first embodiment of the millimeter wave coupling structure 608A. However, the change of the first embodiment is different from the first embodiment in that the coping structure for electrical connection to the semiconductor chip 603B is provided after the millimeter wave coupling structure 608B and the semiconductor chip 603B are formed separately from each other.

Specifically, the dielectric layer 703 having the thickness, $d2$, and corresponding to the dielectric layer 702b in the first embodiment is provided as the base material of the slot pattern structure 710B. Also, the conductor layer 704 is formed on the dielectric layer 703, and the opening portion 712, and the conductor patterns 714 and 716 composing the slot pattern structure 710B are formed in a part of the conductor layer 704. The via hole 708 is formed in the conductor pattern 714. A millimeter wave transmission terminal 709 is formed on the semiconductor chip 603A side of the via hole 708 connected to the conductor pattern 714. The slot pattern structure 710B, including the millimeter wave transmission terminal 709 either may be formed on the CMOS process or may be structured on the substrate made of the dielectric material and composing the dielectric layer 703.

As shown in FIG. 8C, the dielectric layer 702a having a thickness, $d1$, is formed on the silicon layer 700 of the semiconductor chip 603B. The dielectric layer 702a, for example, is made from an oxide film. The transmission path 706 is formed on the surface of the dielectric layer 702a. In FIG. 8C, a portion extending from the silicon layer 700 to the transmission path 706 is the semiconductor chip 603B.

A millimeter wave transmission terminal 707 corresponding to the millimeter wave transmission terminal 709 is formed in an end portion of the transmission path 706. The millimeter wave transmission terminal 707 is formed in the CMOS process concurrently with the formation of other wiring patterns formed on the semiconductor chip 603B.

The millimeter wave transmission terminal 707 on the semiconductor chip 603B, and the millimeter wave transmission terminal 709 provided on a bottom surface of the millimeter wave coupling structure 608B are joined to each other, thereby electrically connecting the transmission path 706, the via hole 708 and the conductor pattern 714 to one another. For example, either the solder ball system or the gold joining system has to be adopted for the joining between the millimeter wave transmission terminal 707 and the millimeter wave transmission terminal 709. A state in which the semiconductor chip 603B and the millimeter wave coupling structure 608B are integrated with each other is identical to the state shown in FIG. 4B.

Although not illustrated, after the semiconductor chip 603B and the millimeter wave coupling structure 608B are integrated with each other, similarly to the case of the method of manufacturing the first embodiment of the millimeter wave coupling structure 608A (refer to FIG. 4C), the encapsulation is carried out so as to cover the entire surface of the conductor layer 704 and the slot pattern structure 710B with the encapsulation resin 604. After that, the transmission path 632 and the antenna structure 636 are formed on the surface of the encapsulation resin 604.

According to the structure of the change of the first embodiment in which the millimeter wave coupling structure 608B and the semiconductor chip 603B are structured separately from each other, there is obtained an advantage that the size and the formation process of the millimeter wave coupling structure 608B are independent of the semiconductor chip 603B.

Figure 9A:
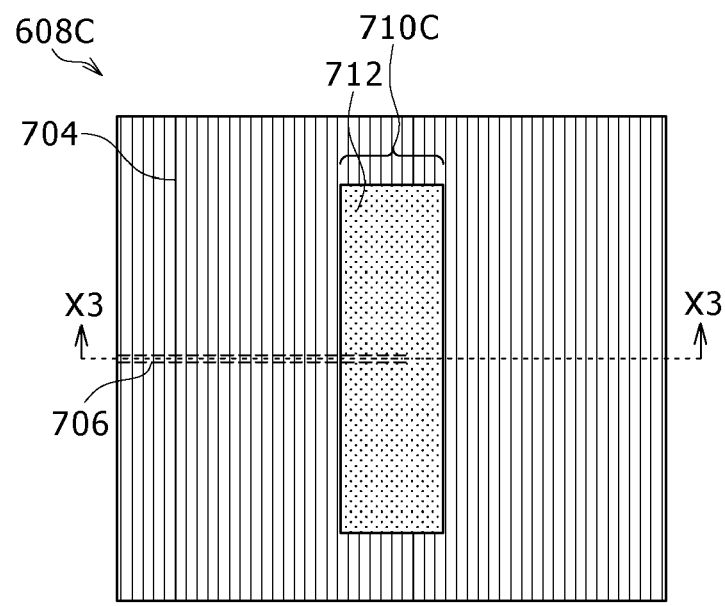
FIGS. 9A and 9B are respectively a top plan view explaining a structure of a second embodiment of a millimeter wave coupling structure, and a cross sectional view taken on line X3-X3 of FIG. 9A.
Figure 9B:
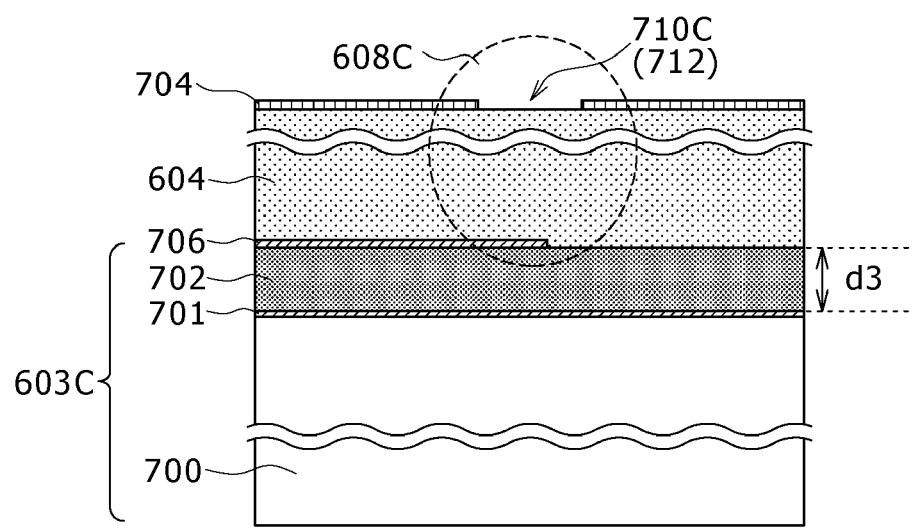
Figure 10A:
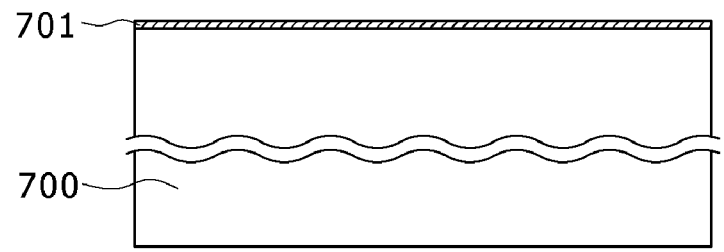
FIGS. 10A to 10C are respectively cross sectional views explaining a method of manufacturing the second embodiment of the semiconductor package
Figure 10B:
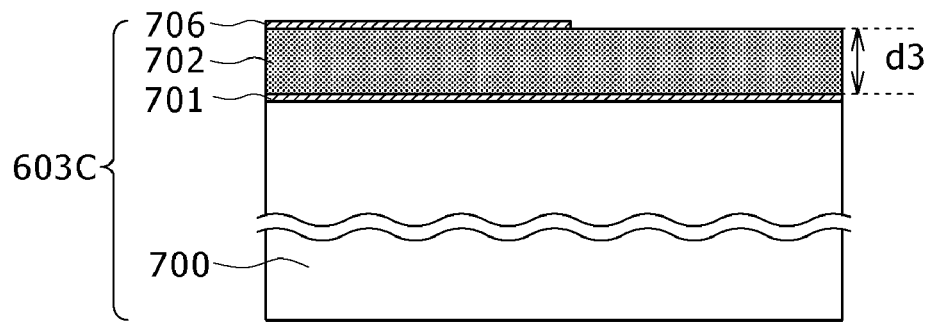
Figure 10C:
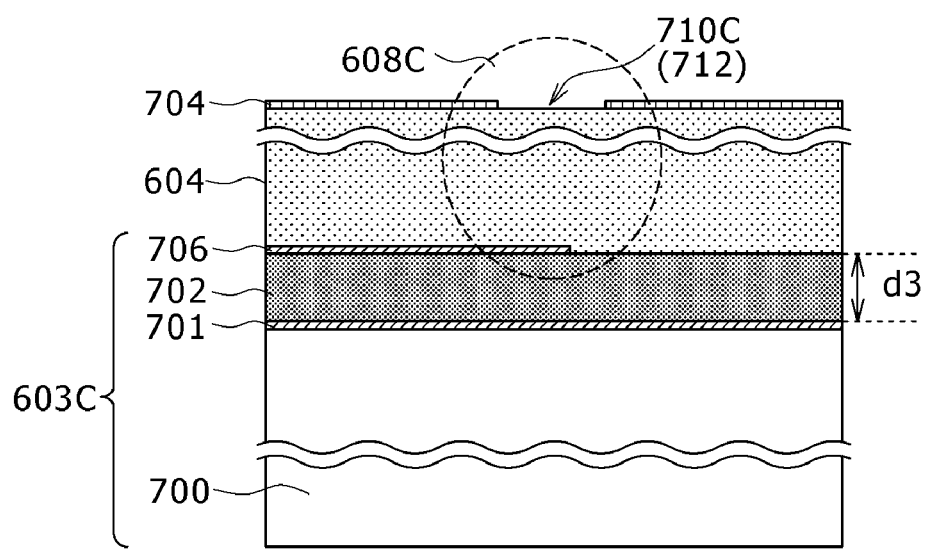

FIGS. 9A and 9B, and FIGS. 10A to 10C are respectively views explaining a second embodiment of the semiconductor package 601 and the millimeter wave coupling structure 608. FIGS. 9A and 9B are respectively a top plan view explaining a structure of the second embodiment of a millimeter wave coupling structure 608C, and a cross sectional view taken on line X3-X3 of FIG. 9A. FIGS. 10A to 10C are respectively cross sectional views explaining a method of manufacturing the second embodiment of the semiconductor package 601 and the millimeter wave coupling structure 608C.

The feature of the second embodiment of the millimeter wave coupling structure 608C is that none of the transmission path 632 and the antenna structure 646 is provided on the surface of the encapsulation resin 604, and the slot pattern structure 710C itself formed on the surface of the encapsulation resin 604 functions as the antenna to directly radiate the electromagnetic wave. With regard to the structure, the strip line transmission path is formed on a surface portion of the semiconductor chip 603C, the conductor layer 704 is formed on the surface of the encapsulation resin 604, and an opening portion 712 is formed in a part of the conductor layer 704, thereby structuring the slot pattern structure 710C.

Structure

Specifically, a thin conductor layer 701, having approximately the same thickness as that of the conductor layer 704 in the first embodiment, is formed on the silicon layer 700, and a dielectric layer 702 having a thickness, d3, is formed on the thin conductor layer 701. The dielectric layer 702, for example, is made from an oxide film. The transmission path 706 extending from the signal wiring (not shown) is formed on the surface of the dielectric layer 702. In FIG. 9B, a portion extending from the silicon layer 700 to the transmission path 706 is the semiconductor chip 603C.

The encapsulation resin 604 is formed so as to cover the dielectric layer 702 and the transmission path 706. Also, the conductor layer 704 is formed in an area portion, composing the slot pattern structure 710C, on the surface of the encapsulation resin 604. The slot pattern structure 710C is formed on a part of the conductor layer 702.

The slot pattern structure 710C is composed of the opening portion 712 formed in the conductor layer 704. A method of forming the conductor layer 701, the dielectric layer 702, and the conductor layer 704 composing the slot pattern structure 710C may be the same as the process, such as a metal wiring process, for forming the conductor pattern for the circuit wirings on the silicon layer 700 composing the semiconductor chip 603C having the CMOS configuration. Thus, the conductor layer 701, the dielectric layer 702, and the conductor layer 704 composing the slot pattern structure 710C are formed concurrently with the formation of the conductor pattern for the circuit wirings.

Although as also previously stated, the encapsulation resin 604 is generally applied to the purpose of fixing the bonding wires 617 and enhancing the chip reliability, in this structure, the encapsulation resin 604 has the function as well of transmitting and radiating the electromagnetic wave in the portion of the millimeter wave coupling structure 608C (the slot pattern structure 710C).

In such a millimeter wave coupling structure 608C, firstly, the conductor layer 701, the dielectric layer 702, and the transmission path 706 form the strip line transmission path in the CMOS process.

The slot pattern structure 710C as the biggest characteristic portion in this structure radiates the electromagnetic wave. That is to say, with the millimeter wave coupling structure 608C having such a structure, for the millimeter wave signal, the transmission path 706 electrically connected to the signal wiring of the semiconductor chip 103 and the opening portion 712 of the slot pattern structure 710C are electromagnetically coupled to each other by the millimeter wave transmission medium 634 formed in the encapsulation resin 604 between the transmission path 706 and the opening portion 712 of the slot pattern structure 710C. As a result, the millimeter wave which has been transmitted through the millimeter wave transmission medium 634 is radiated in the form of the electromagnetic wave. The slot pattern structure 710C, and the opening portion 712 functions as the antenna to radiate the electromagnetic wave.

A method of manufacturing the second embodiment of the millimeter wave coupling structure 608C is as shown in FIGS. 10A to 10C.

Specifically, the conductor layer 701 is formed on the silicon layer 700 (refer to FIG. 10A), the dielectric layer 702 having a thickness, d, is formed on the conductor layer 701, and the transmission path 706 is formed on the dielectric layer 702 (refer to FIG. 10B).

The method of forming the conductor layer 701 and the transmission path 706 may be carried out concurrently with the carrying-out of the process, such as a metal wiring process, for forming the conductor pattern for the circuit wirings on the silicon layer 700 composing the semiconductor chip 603A having the CMOS configuration. Thus, there is an advantage that the conductor layer 701 and the transmission path 706 can be formed integrally with the conductor pattern for the circuit wirings.

After that, the encapsulation is carried out so as to cover the entire surface of the dielectric layer 702 and the transmission path 706 with the encapsulation resin 604. After that, the opening portion 712 composing the slot pattern structure 710C is obtained by utilizing the etching method after the conductor layer 704 is formed on the surface of the encapsulation resin 604 (refer to FIG. 10C).

The conductor layer 704 in which the opening portion 712 composing the slot pattern structure 710C is formed by utilizing the method such as plating (evaporation), etching after the sticking of the conductor plate, or the sticking of the sticker having the pattern formed thereon. When the sticker having the metallic pattern formed thereon is stuck to the surface of the encapsulation resin 604 in the manner as described above, there is an advantage that the antenna pattern (the pattern of the opening portion 712 in this case) can be changed by swapping the sticker.

FIGS. 11A and 11B are respectively views explaining a first embodiment of a wireless transmission system 1. That is to say, FIGS. 11A and 11B are respectively a top plan view of the first embodiment of the wireless transmission system 1, and a cross sectional view taken on line X3-X3 of FIG. 11A.

The first embodiment of the wireless transmission system 1A is an embodiment in which the wireless transmission system 1 is structured by utilizing the semiconductor package 601 having the millimeter coupling structure 608 described above. In this case, the present invention is applied to the millimeter wave wireless transmission among a plurality of semiconductor packages 601. A millimeter wave signal transmission path 9 between the semiconductor packages 601 has, for example, a waveguide structure, or a millimeter wave confining structure, such as a cavity or a dielectric transmission path. The wireless transmission system 1A has a system structure that the millimeter wave is coupled to the cavity or the dielectric transmission path. The millimeter wave transmission path made of a dielectric material through the slot pattern structure 710, thereby carrying out the data transmission between the semiconductor packages 601.

Two semiconductor packages 601_1 and 602_2 are mounted to a circuit substrate (not shown) so as to be horizontally shifted from each other. A semiconductor package to which the second embodiment of the millimeter wave coupling structure 608C is applied is used as each of the semiconductor packages 601_1 and 602_2.

The millimeter wave signal transmission path 9 is mounted so as to build a bridge between the semiconductor packages 601_1 and 602_2. The millimeter wave signal transmission path 9 either may be one an outer periphery of which is made of a shielding material and an inside of which is hollow, or may be a dielectric transmission path 9A made of a dielectric material.

Preferably, the transmission path is structured in such a way that both ends of the millimeter wave signal transmission path 9 are electromagnetically either opened or short-circuited. For example, an example of the structure of the transmission path is such that conductors are formed in the end surfaces of the millimeter wave coupling structure 608C, and a position extending from a center of the millimeter wave coupling structure 608C to an end surface of the millimeter wave signal transmission path 9 is set as a position where the open or the short-circuit is obtained.

Although the case of the open, the millimeter wave leaking from each of the end portions may become a problem, there is obtained an effect that a standing wave can be prevented from being formed within the millimeter wave signal transmission path 9. On the other hand, although in the case of the short-circuit, the standing wave is feared to be formed, there is obtained an advantage that the sensitivity can be enhanced due to the reflection effect.

With the wireless transmission system 1A having such a structure, the millimeter wave signal is coupled to the millimeter wave signal transmission path 9 through the millimeter wave coupling structures 608C such as the slot pattern structures 710C, of the semiconductor packages 601_1 and 601_2. As a result, the data can be transmitted between the semiconductor packages 601_1 and 601_2 in which the millimeter wave coupling structures 608C are provided in parallel with each other through the millimeter wave signal transmission path 9.

Note that, all it takes is that reflectors are mounted to the transmission side and the reception side of the millimeter wave signal transmission path 9, respectively, whereby a traveling direction of the millimeter wave radiated from the millimeter wave coupling structure 608C to the millimeter wave signal transmission path 9 side is converted into an extension direction of the millimeter wave signal transmission path 9. In this case, the millimeter wave or electromagnetic wave radiated from the millimeter wave coupling structure 608C of one semiconductor package 601_1 travels in a thickness direction of the millimeter wave signal transmission path 9. After that, the electromagnetic wave is reflected by the reflector provided on the transmission side to travel in the extension direction of the millimeter wave signal transmission path 9. In addition, the electromagnetic wave reaches the millimeter wave coupling structure 608C of the other semiconductor package 601_2.

FIGS. 12A and 12B are respectively views explaining a second embodiment of the wireless transmission system 1. That is to say, FIGS. 12A and 12B are respectively a top plan view explaining the second embodiment of the wireless transmission system 1, and a cross sectional view taken on line X3-X3 of FIG. 12A.

The second embodiment of the wireless transmission system 1B is an embodiment in which the wireless transmission system 1 is structured by utilizing the semiconductor package 601 having the millimeter coupling structure 608 described above. Similarly to the case of the first embodiment of the wireless transmission system 1A, the present invention is applied to the millimeter wave wireless transmission among a plurality of semiconductor packages 601. The second embodiment of the wireless transmission system 1B is different from the first embodiment of the wireless transmission system 1A in that the millimeter wave signal transmission path 9 between the semiconductor packages 601 is structured inside a metallic body 800.

The two semiconductor packages 601_1 and 602_2 are mounted to the circuit substrate (not shown) so as to be horizontally shifted from each other. The semiconductor package to which the second embodiment of the millimeter wave coupling structure 608C is applied is used as each of the semiconductor packages 601_1 and 602_2.

The metallic body 800 is mounted so as to build a bridge between the semiconductor packages 601_1 and 602_2. A chassis, such as a chassis made of a metallic material, or a heat radiating plate, for example, can be used as the metallic body 800. For example, the two semiconductor packages 601_1 and 601_2 on the circuit substrate are disposed so as for each of surfaces thereof to contact the chassis. The chassis made of the metallic material, for example, is a set box or case used in a digital recording/reproducing apparatus, a terrestrial TV receiver, a mobile phone, a game machine, a computer, a communication apparatus, or the like. The original purpose of the heat radiating plate is to radiate the heat of the semiconductor packages 601_1 and 601_2 themselves. Although in any case, the metallic body 800 has the function of radiating the heat of the semiconductor packages 601_1 and 601_2, in the second embodiment of the wireless transmission system 1B, in addition thereto, the millimeter wave signal transmission path 9 is provided inside the metallic body 800.

Specifically, as shown in FIGS. 12A and 12B, the cavity is formed inside the metallic body 800 so as to structure the millimeter wave signal path 9 having the waveguide structure. Preferably, similarly to the case of the first embodiment of the wireless transmission system 1A, the transmission path is structured in such a way that both the ends of the millimeter wave signal transmission path 9 are electromagnetically opened or short-circuited. In addition, all it takes is that reflectors are mounted to the transmission side and the reception side of the millimeter wave signal transmission path 9, respectively, similarly to the case of the first embodiment of the wireless transmission system 1A, whereby the traveling direction of the millimeter wave radiated from the millimeter wave coupling structure 608C to the millimeter wave signal transmission path 9 side is converted into the extension direction of the millimeter wave signal transmission path 9.

The conductor layers 704 formed on the surfaces of the encapsulation resins 604 of the semiconductor packages 601_1 and 601_2, and the metallic body 800 are disposed in close contact with each other through both the planes. As a result, there is obtained an effect that it is possible to prevent the leakage of the millimeter wave, and it is possible to enhance the heat radiation property.

Even with the wireless transmission system 1B having such a structure, similarly to the case of the first embodiment of the wireless transmission system 1A, the millimeter wave signal is coupled to the millimeter wave signal transmission path 9 through the millimeter wave coupling structures 608C such as the slot pattern structures 710C of the semiconductor packages 601_1 and 601_2. As a result, the data can be transmitted between the semiconductor packages 601_1 and 601_2 in which the millimeter wave coupling structures 608C are provided in parallel with each other through the millimeter wave signal transmission path 9.

Changes

Although each of the first and second embodiments of the wireless transmission systems 1A and 1B described above has the form in which a plurality of semiconductor packages 601 are disposed in parallel with each other on the same circuit substrate, the present invention is by no means limited to the parallel provision form. Although not illustrated, there may also be adopted a form such that the millimeter wave transmission is carried out either in a state in which a plurality of semiconductor package 601 are laminated and disposed approximately on the same axis, or in a state in which the circuit substrate having a plurality of semiconductor packages 601 mounted thereto is disposed in such a way that the semiconductor chips 603 face each other. The applicant of this application previously filed Japanese Patent Application JP 2009-164506 relating to the millimeter wave wireless transmission between the semiconductor packages. Thus, it is possible to adopt a system structure that the semiconductor package described in Japanese Patent Application JP 2009-164506 is replaced with the semiconductor package in the first and second embodiments of the wireless transmission systems 1A and 1B.

It should be understood by those skilled in the art that various modifications, combinations, sub-combinations and alterations may occur depending on design requirements and other factors insofar as they are within the scope of the appended claimed or the equivalents thereof.

What is claimed is:

1. A device comprising:
a semiconductor package which allows transmission therethrough of a radio signal;
a chip which generates the radio signal;
a coupler adjacent the chip and effective to radiate the radio signal to outside of the semiconductor package;
a semiconductor layer within the semiconductor package;
a dielectric layer above the semiconductor layer, the dielectric layer including a transmission path therein;
a via hole in the dielectric layer;
a conductor layer on the dielectric layer; and
a pattern in the conductor layer formed by at least two openings in the conductor layer and a portion of the conductor layer in between the openings,
wherein,
the semiconductor layer and the dielectric layer form the chip,
the via hole is operatively connected to the transmission path and the conductor layer, and
the conductor pattern is effective to improve the strength of the radio signal transmitted between the transmission path and a surface of the semiconductor package.

2. The device according to claim 1, wherein:
the conductor layer faces the transmission path;
in the conductor layer includes a slot structure comprising an opening, and
the transmission path and the slot structure are coupled to each other.

3. The device according to claim 2, wherein the slot structure and the transmission path are electromagnetically coupled to each other.

4. A device comprising:
a semiconductor package which allows transmission therethrough of a radio signal;
a chip which generates the radio signal; and
a coupler adjacent the chip and effective to radiate the radio signal to outside of the semiconductor package;
a semiconductor layer within the semiconductor package;
a dielectric layer above the semiconductor layer, the dielectric layer including a transmission path therein;
a via hole in the dielectric layer;
a conductor layer on the dielectric layer; and
a pattern in the conductor layer formed by at least two openings in the conductor layer and a portion of the conductor layer in between the openings,
wherein,
the semiconductor layer and the dielectric layer form the chip, the via hole is operatively connected to the transmission path and the conductor layer,
the pattern in the conductor layer includes a plurality of openings in the conductor layer and a plurality of portions of the conductor layer in between the openings, and
the portions of the conductor layer in the pattern are not electrically connected to each other, and
one of the portions of the conductor layer is electrically connected to the transmission path.

5. The device according to claim 4, further comprising:
an antenna on the semiconductor package,
wherein,
the coupler adjacent the chip is effective to radiate the radio signal to the antenna.

6. The device according to claim 5, further comprising:
a second transmission path in between the semiconductor package and the antenna, wherein,
the second transmission path and the antenna are electrically connected to each other.

7. The device according to claim 1, wherein the transmission path is a wireless transmission path which is effective to transmit the radio signal.

8. The device according to claim 7, wherein the structure is a waveguide.

9. A semiconductor device comprising:
a semiconductor layer;
a semiconductor chip in the semiconductor layer;
a dielectric layer on the semiconductor layer;
an encapsulation member on the dielectric layer to encapsulate the semiconductor chip;
a transmission path in-between the dielectric layer and the encapsulation member on the dielectric layer;
a conductor layer on the surface of the encapsulation member; and
a slot structure comprising an opening in the conductor layer.

10. A semiconductor device comprising:
a semiconductor layer;
a semiconductor chip including an electric circuit having a communication function, the semiconductor chip in the semiconductor layer;
a dielectric layer on the semiconductor layer;
an encapsulation member on the dielectric layer to encapsulate the semiconductor chip;
a transmission path effective to transmit a high-frequency signal to and from the electric circuit;
a conductor layer facing the transmission path;
a slot structure comprising an opening in the conductor layer,
wherein,
the transmission path and the slot structure are coupled to each other and are effective to transmit an electromagnetic wave between the transmission path and the encapsulation member.

11. An electronic apparatus comprising:
a semiconductor package which allows transmission therethrough of a radio signal;
a chip which generates the radio signal;
a coupler adjacent the chip and effective to radiate the radio signal to outside of the semiconductor package;
a semiconductor layer within the semiconductor package;
a dielectric layer above the semiconductor layer, the dielectric layer including a transmission path therein;
a via hole in the dielectric layer;
a conductor layer on the dielectric layer; and
a pattern in the conductor layer formed by at least two openings in the conductor layer and a portion of the conductor layer in between the openings,
wherein,
the semiconductor layer and the dielectric layer form the chip,
the via hole is operatively connected to the transmission path and the conductor layer, and
the conductor pattern is effective to improve the strength of the radio signal transmitted between the transmission path and a surface of the semiconductor package.

* * * * *